United States Patent
Lee et al.

(10) Patent No.: US 9,711,531 B2
(45) Date of Patent: Jul. 18, 2017

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Woong-Seop Lee, Gyeonggi-do (KR); Jongyoon Choi, Seoul (KR); Jinhyun Shin, Suwon-si (KR); Dong-Sik Lee, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/285,682

(22) Filed: Oct. 5, 2016

(65) Prior Publication Data
US 2017/0103997 A1    Apr. 13, 2017

Related U.S. Application Data

(60) Provisional application No. 62/239,061, filed on Oct. 8, 2015.

(30) Foreign Application Priority Data

Dec. 8, 2015  (KR) ........................ 10-2015-0174317

(51) Int. Cl.
| | |
|---|---|
| H01L 29/76 | (2006.01) |
| H01L 27/11582 | (2017.01) |
| H01L 29/10 | (2006.01) |
| H01L 27/11568 | (2017.01) |
| H01L 29/04 | (2006.01) |
| H01L 27/11565 | (2017.01) |
| H01L 29/423 | (2006.01) |
| H01L 21/02 | (2006.01) |

(52) U.S. Cl.
CPC .... *H01L 27/11582* (2013.01); *H01L 21/0243* (2013.01); *H01L 21/02636* (2013.01); *H01L 27/11565* (2013.01); *H01L 27/11568* (2013.01); *H01L 29/04* (2013.01); *H01L 29/1037* (2013.01); *H01L 29/1054* (2013.01); *H01L 29/4234* (2013.01)

(58) Field of Classification Search
CPC ............ H01L 29/7926; H01L 29/4234; H01L 27/11565
See application file for complete search history.

(56) References Cited

U.S. PATENT DOCUMENTS

| | | | |
|---|---|---|---|
| 8,084,819 | B2 | 12/2011 | Kim et al. |
| 8,916,922 | B2 | 12/2014 | Jang et al. |
| RE45,554 | E | 6/2015 | Alsmeier |
| 9,076,879 | B2 | 7/2015 | Yoo et al. |

(Continued)

FOREIGN PATENT DOCUMENTS

| | | |
|---|---|---|
| KR | 1020100034612 | 4/2010 |
| KR | 1020120128438 | 11/2012 |

*Primary Examiner* — Julia Slutsker
(74) *Attorney, Agent, or Firm* — Ward and Smith, P.A.

(57) ABSTRACT

A method of fabricating a semiconductor device can include forming a channel hole in a vertical stack of alternating insulating and sacrificial layers to form a recess in a substrate. A selectively epitaxial growth can be performed to provide a lower semiconductor pattern in the recess using material of the substrate as a seed and a recess can be formed to penetrate an upper surface of the lower semiconductor pattern via the channel hole.

19 Claims, 21 Drawing Sheets

(56) References Cited

U.S. PATENT DOCUMENTS

| | | | |
|---|---|---|---|
| 2012/0083077 A1* | 4/2012 | Yang | H01L 27/11582 438/156 |
| 2014/0035026 A1* | 2/2014 | Jang | H01L 29/792 257/324 |
| 2014/0070302 A1* | 3/2014 | Yoo | H01L 27/1157 257/324 |
| 2014/0239376 A1 | 8/2014 | Zhang et al. | |
| 2015/0115348 A1 | 4/2015 | Nam et al. | |

\* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 from U.S. Provisional Patent application Ser. No. 62/239,061, filed on Oct. 8, 2015 in the United States Patent and Trademark Office, and Korean Patent Application No. 10-2015-0174317, filed on Dec. 8, 2015, in the Korean Intellectual Property Office, the entire contents of each of which are hereby incorporated by reference.

BACKGROUND

The present disclosure relates to the field of semiconductors, and in particular, to three-dimensional semiconductor memory devices and a method of fabricating the same.

In the case of typical two-dimensional or planar semiconductor devices, integration may be determined by the area occupied by a unit memory cell, which can be related to the level of fine patterning technology used to form those cells. The expense associated with the processing equipment used fine patterning may, however, limit the integration for two-dimensional or planar semiconductor devices.

To overcome such a limitation, three-dimensional (3D) semiconductor devices, including three-dimensionally-arranged memory cells, have been proposed. There may be, however, significant manufacturing obstacles in achieving low-cost, mass-production of 3D semiconductor memory devices, particularly in the mass-fabrication of 3D devices that maintain or exceed the operational reliability of their 2D counterparts.

SUMMARY

In some embodiments, a method of fabricating a semiconductor device can include forming a channel hole in a vertical stack of alternating insulating and sacrificial layers to form a recess in a substrate. A selectively epitaxial growth can be performed to provide a lower semiconductor pattern in the recess using material of the substrate as a seed and a recess can be formed to penetrate an upper surface of the lower semiconductor pattern via the channel hole.

In some embodiments, a semiconductor device can include a stack including insulating layers and gate electrodes alternatingly and repeatedly stacked on a substrate. A lower semiconductor pattern can protrude in a vertical direction from the substrate into the stack. An upper portion of the lower semiconductor pattern can have a width that gradually decreases in a direction away from the substrate. A channel structure can vertically penetrate the stack and connect to the lower semiconductor pattern and an insulating gapfill pattern can be inside the channel structure, where a bottom surface of the insulating gapfill pattern is lower than a bottom of the upper portion of the lower semiconductor pattern.

In some embodiments, a semiconductor device can include a stack including insulating layers and gate electrodes alternatingly and repeatedly stacked on a substrate. A lower semiconductor pattern can protrude in a vertical direction from the substrate into the stack. An upper portion of the lower semiconductor pattern can have a width that gradually decreases in a direction away from the substrate and a channel structure can penetrate the stack and connect to the lower semiconductor pattern, where a lower portion of the channel structure can penetrate the upper portion of the lower semiconductor pattern.

In some embodiments, a semiconductor device can include a stack including insulating layers and gate electrodes alternatingly and repeatedly stacked on a substrate. A lower semiconductor pattern can protrude in a vertical direction from the substrate into the stack. A channel structure can be in the stack and connected to the lower semiconductor pattern and an insulating gapfill pattern can be in the channel structure, where the insulating gapfill pattern has a curved bottom surface.

In some embodiments, a method of fabricating a semiconductor device can include alternatingly and repeatedly stacking insulating layers and sacrificial layers on a substrate and forming a channel hole to penetrate the insulating layers and the sacrificial layers and expose the substrate. A selective epitaxial growth process can be performed to grow a lower semiconductor pattern from a top portion of the substrate that is exposed by the channel hole, where an upper portion of the lower semiconductor pattern is formed to have a width that gradually decreases in a direction away from the substrate. A recess region can be formed to penetrate the upper portion of the lower semiconductor pattern. A channel structure can be formed to fill the channel hole and the recess region and the sacrificial layers can be replaced with gate electrodes.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
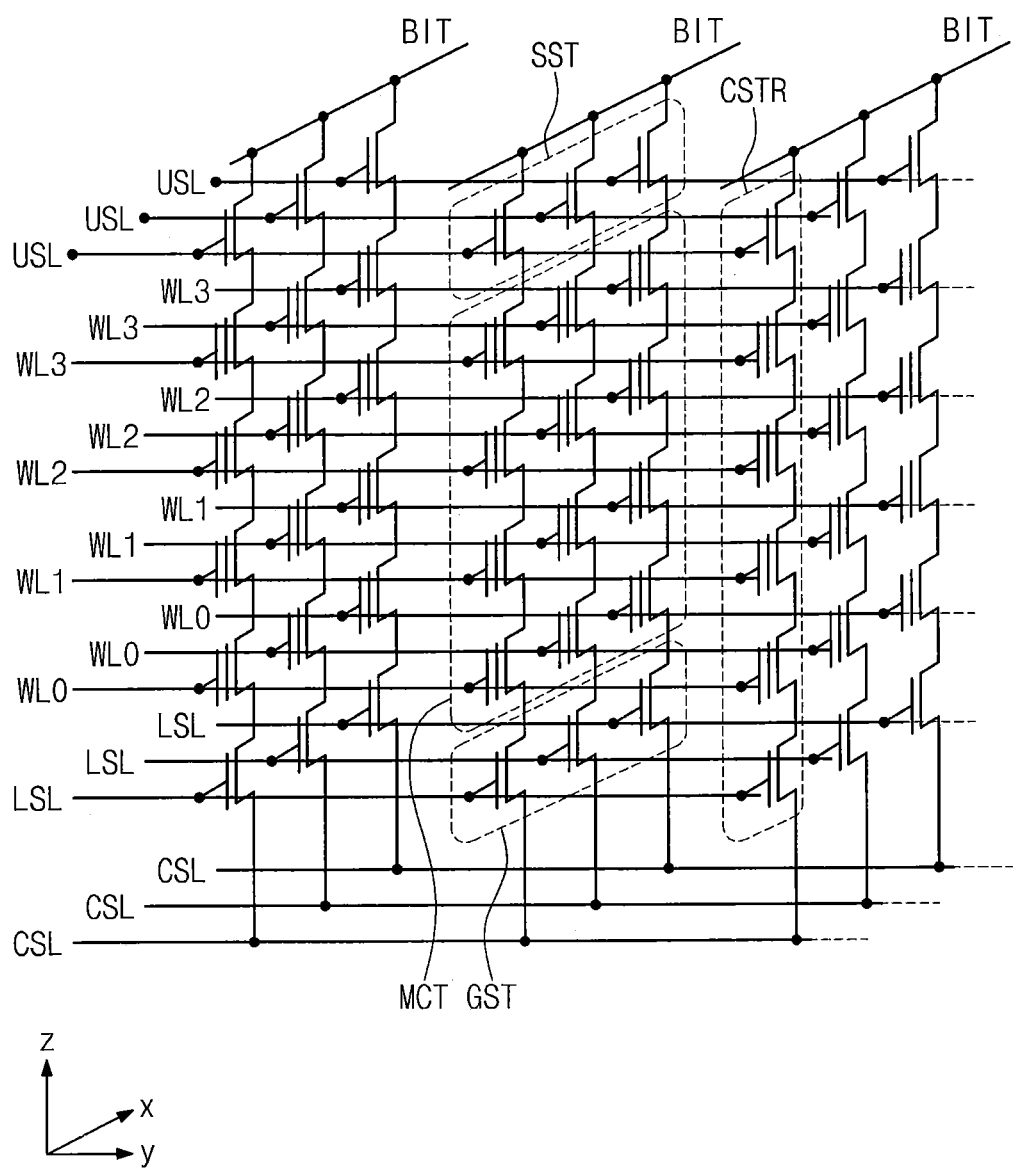
FIG. 1 is a circuit diagram schematically illustrating a cell region of a three-dimensional semiconductor memory device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIG. 1 is a circuit diagram schematically illustrating a cell region of a three-dimensional semiconductor memory device according to some embodiments of the inventive concept.

Referring to FIG. 1, a cell array of a three-dimensional semiconductor memory device may include a common source line CSL, a plurality of bit lines BIT, and a plurality of cell strings CSTR disposed between the common source line CSL and the bit lines BIT.

The common source line CSL may be a conductive pattern disposed on a substrate or an impurity region formed in the substrate. In some embodiments, the common source line CSL may be a conductive pattern (e.g., a metal line) that is provided on and vertically spaced apart from the substrate. The bit lines BIT may be conductive patterns (e.g., metal lines) that are provided on and vertically spaced apart from the substrate. In some embodiments, the bit lines BIT may be provided to cross the common source line CSL and may be vertically spaced apart from the common source line CSL. The bit lines BIT may be two-dimensionally arranged and a plurality of the cell strings CSTR may be connected in parallel to each of the bit lines BIT. The cell strings CSTR may be connected in common to the common source line CSL. For example, a plurality of the cell strings CSTR may be disposed between the bit lines BIT and the common source line CSL. In some embodiments, a plurality of common source lines CSL may be two-dimensionally provided on the substrate. In some embodiments, the common source lines CSL may be applied with the same voltage, but in certain embodiments, the common source lines CSL may be separated from each other and thereby may be independently biased.

Each of the cell strings CSTR may include a ground selection transistor GST coupled to the common source line CSL, a string selection transistor SST coupled to the bit line BIT, and a plurality of memory cell transistors MCT disposed between the ground and string selection transistors GST and SST. Furthermore, the ground selection transistor GST, the string selection transistor SST, and the memory cell transistors MCT may be connected in series.

The common source line CSL may be connected in common to source regions of the ground selection transistors GST. Furthermore, at least one lower selection line LSL, a plurality of word lines WL0-WL3, and a plurality of upper selection lines USL may be disposed between the common source line CSL and the bit lines BIT to serve as respective gate electrodes of the ground selection transistor GST, the memory cell transistors MCT, and the string selection transistors SST. In addition, each of the memory cell transistors MCT may include a data storage element.

Figure 2:
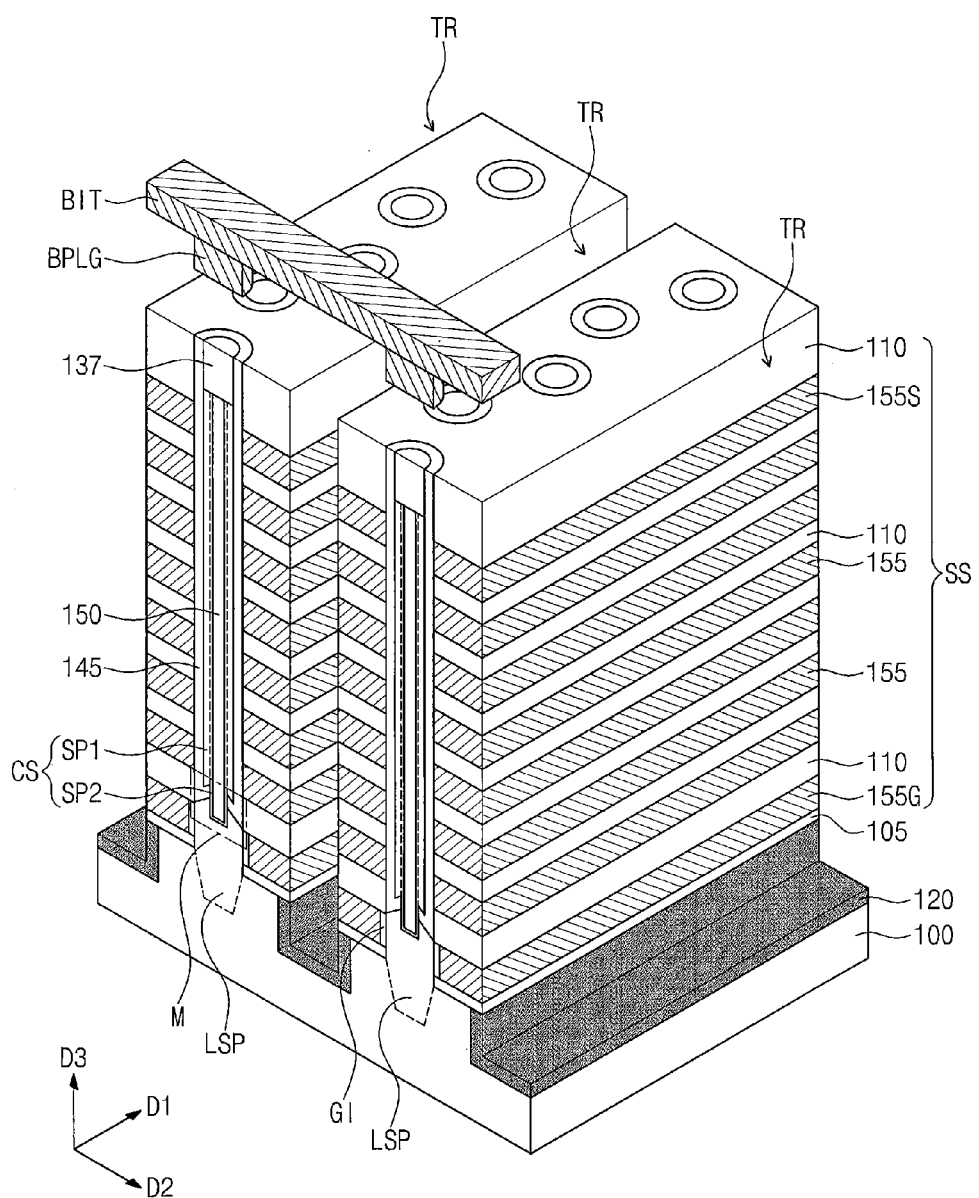
FIG. 2 is a perspective view illustrating a three-dimensional semiconductor memory device according to some embodiments of the inventive concept.
Figure 3:
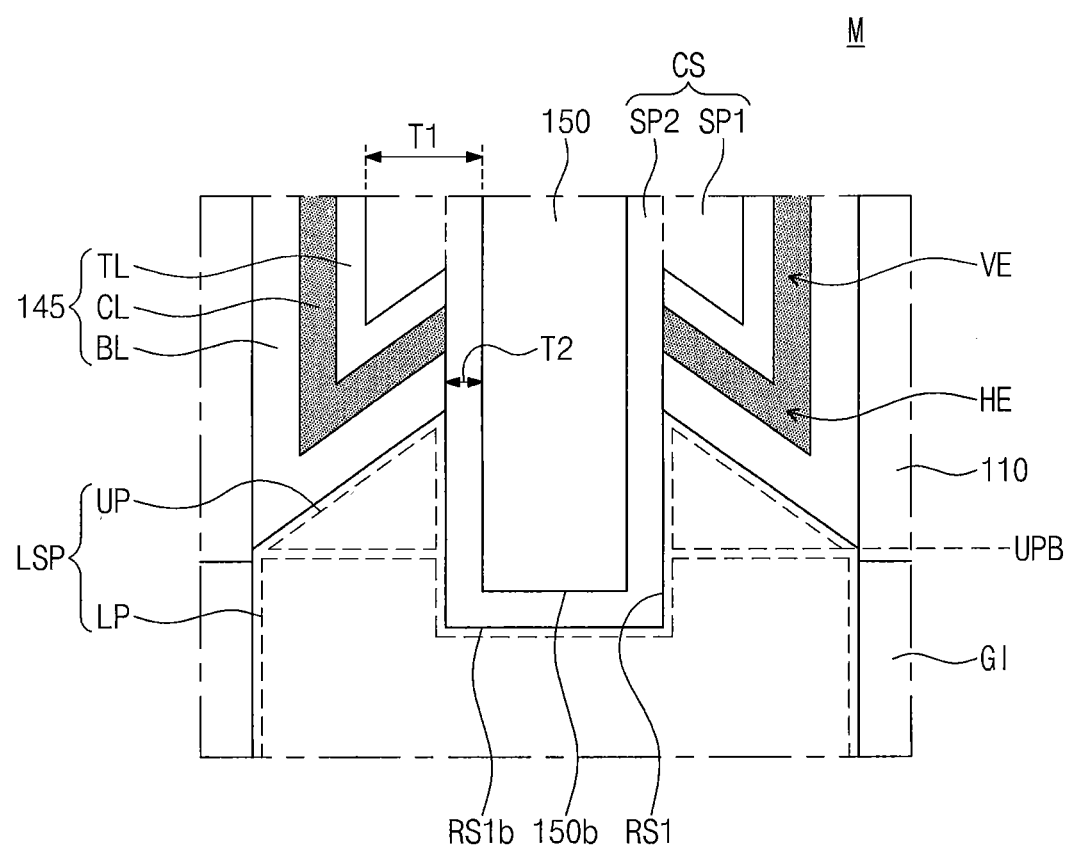
FIG. 3 is an enlarged sectional view of a portion 'M' of FIG. 2.

FIG. 2 is a perspective view illustrating a three-dimensional semiconductor memory device according to some embodiments of the inventive concept. FIG. 3 is an enlarged sectional view of a portion 'M' of FIG. 2.

Referring to FIGS. 2 and 3, a substrate 100 may be provided. The substrate 100 may be a silicon substrate, a germanium substrate, or a silicon-germanium substrate. The substrate 100 may include common source regions 120 doped with impurities. Each of the common source regions 120 may be a line-shape structure extending in a first direction D1 parallel to a top surface of the substrate 100. The common source regions 120 may be disposed spaced apart from each other in a second direction D2 crossing the first direction D1.

Insulating layers 110 and gate electrodes 155 may be alternately and repeatedly stacked on the substrate 100 to form a stack SS. In certain embodiments, a plurality of stacks SS may be provided on the substrate 100, but for the sake of simplicity, the description that follows will refer to an example in which only a single stack SS is provided. When viewed in a plan view, the stack SS may be a line-shaped structure extending in the first direction D1. The common source regions 120 may be provided at both sides of the stack SS. A lower insulating layer 105 may be provided between the substrate 100 and the stack SS. The lower insulating layer 105 may include a silicon nitride layer or a high-k dielectric layer (e.g., aluminum oxide or hafnium oxide). The lower insulating layer 105 may have a thickness less than that of the insulating layers 110.

The gate electrodes 155 may be stacked in a third direction D3, which are perpendicular to both the first and second directions D1 and D2. The gate electrodes 155 may be vertically separated from each other by the insulating layers 110 interposed therebetween. In some embodiments, the lowermost one 155G of the gate electrodes 155 may be used as a gate electrode (e.g., the lower selection line) of the ground selection transistor GST described with reference to FIG. 1. The uppermost one 155S of the gate electrodes 155 may be used as a gate electrode (e.g., the upper selection line) of the string selection transistor SST described with reference to FIG. 1. The gate electrodes 155 positioned between the lowermost gate electrode 155G and the uppermost gate electrode 155S may be used as gate electrodes (e.g., the word lines) of the memory cell transistors MCT described with reference to FIG. 3. For example, the gate electrodes 155 may be formed of or include at least one of doped silicon, metals (e.g., tungsten), metal nitrides, or metal silicides. The insulating layers 110 may be formed of or include silicon oxide.

The substrate 100 may include lower semiconductor patterns LSP at an upper portion thereof. The lower semiconductor patterns LSP may protrude upward from the top surface of the substrate 100 and may pass through the lower insulating layer 105 and the lowermost gate electrode 155G. The lower semiconductor patterns LSP may be provided to penetrate a portion of the insulating layer 110 on the lowermost gate electrode 155G. In other words, the lower semiconductor patterns LSP may have top surfaces positioned between bottom and top surfaces of the insulating layer 110.

The lower semiconductor patterns LSP may be formed of or include a semiconductor material, whose conductivity type is the same as that of the substrate 100. In some embodiments, the lower semiconductor patterns LSP may be epitaxial patterns that are epitaxially grown using the substrate 100 as a seed layer. In this case, the lower semiconductor patterns LSP may have a single- or poly-crystalline structure. The lower semiconductor patterns LSP may be formed of or include silicon.

Referring back to FIG. 3, the lower semiconductor patterns LSP may be formed by a selective epitaxial growth (SEG) process, and thus, top surfaces of the lower semiconductor patterns LSP may have a non-zero curvature (non-planar). For example, each of the lower semiconductor patterns LSP may have a convex top surface protruding in an upward direction. As an example, each of the lower semiconductor patterns LSP may include an upper portion UP having a gradually decreasing width (or sloped profile) in a direction away from the substrate 100 (i.e., in the third direction D3) and a lower portion LP thereunder. A width of the lower portion LP may be substantially uniform in the third direction D3. In certain embodiments, the lower semiconductor pattern LSP may have a substantially flat top surface. In other words, the upper portion UP of the lower semiconductor pattern LSP may not have the tapering profile.

In each of the lower semiconductor patterns LSP, a first recess region RS1 may be formed to penetrate the upper portion UP. The first recess region RS1 may have a bottom RS1b, which is positioned at a lower level than a bottom level UPB of the upper portion UP.

Referring back to FIG. 2, a gate insulating layer GI may be interposed between the lower semiconductor pattern LSP and the lowermost gate electrode 155G adjacent thereto. As an example, the gate insulating layer GI may be formed of or include silicon oxide.

A plurality of channel structures CS may be provided to penetrate the stack SS and may be electrically connected to the substrate 100. When viewed in a plan view, the channel structures CS may be arranged in the first direction D1. In certain embodiments, the channel structures CS may be disposed to have a zigzag arrangement in the first direction D1. An internal space of each of the channel structures CS may be filled with an insulating gapfill pattern 150.

A vertical insulator 145 may be interposed between the stack SS and each of the channel structures CS. The vertical insulator 145 may extend in the third direction D3. The vertical insulator 145 may be a pipe-shaped or macaroni-shaped structure with open top and bottom.

Referring back to FIG. 3, the vertical insulator 145 may include a blocking insulating layer BL, a charge storing layer CL, and a tunnel insulating layer TL which are stacked sequentially. The blocking insulating layer BL may be in contact with sidewalls of the gate electrodes 155 and with the upper portion UP of the lower semiconductor pattern LSP. The tunnel insulating layer TL may be in contact with the channel structure CS. The charge storing layer CL may be interposed between the blocking insulating layer BL and the tunnel insulating layer TL.

The charge storing layer CL may include at least one of a silicon nitride layer, a silicon oxynitride layer, a silicon-rich nitride layer, a nanocrystalline silicon layer, or a laminated trap layer. The tunnel insulating layer TL may include a material having a band gap greater than that of the charge storing layer CL. For example, the tunnel insulating layer TL may be a silicon oxide layer. The blocking insulating layer BL may include at least one of materials, whose band gaps are greater than that of the charge storing layer CL. As an example, the blocking insulating layer BL may include at least one of a silicon oxide layer, a silicon nitride layer, or a silicon oxynitride layer.

The vertical insulator 145 may include a horizontally extended portion HE, which is interposed between the lower semiconductor pattern LSP and a first semiconductor pillar SP1 (described further), and a vertically extended portion VE, which extends from the horizontally extended portion HE in the third direction D3. The horizontally extended portion HE may be provided to directly cover the top surface of the lower semiconductor pattern LSP. The horizontally extended portion HE may have an inclined profile, because the upper portion UP of the lower semiconductor pattern LSP has an upward convex structure and the horizontally extended portion HE is formed to cover the top surface of the lower semiconductor pattern LSP.

Each of the channel structures CS may include a first semiconductor pillar SP1 and a second semiconductor pillar SP2. The first semiconductor pillar SP1 may be provided to enclose an outer sidewall of the second semiconductor pillar SP2. The first semiconductor pillar SP1 may also be provided to cover an inner sidewall of the stack SS. The first semiconductor pillar SP1 may be a pipe-shaped or macaroni-shaped structure with open top and bottom. The first semiconductor pillar SP1 may be spaced apart from the substrate 100. The second semiconductor pillar SP2 may have a pipe-shaped or macaroni-shape structure with closed bottom.

The second semiconductor pillar SP2 may include a lower portion, which passes through a bottom of the first semiconductor pillar SP1 and is inserted into the first recess region RS1. In other words, a bottom surface of the second semiconductor pillar SP2 may be positioned at a lower level than that of the first semiconductor pillar SP1. Furthermore, the lower portion of the second semiconductor pillar SP2 may sequentially pass through the tunnel insulating layer TL, the charge storing layer CL and the blocking insulating layer BL and may contact the lower semiconductor pattern LSP. Accordingly, the second semiconductor pillar SP2 may allow the first semiconductor pillar SP1 to be electrically connected to the substrate 100 or the lower semiconductor pattern LSP. The second semiconductor pillar SP2 may be provided to allow a bottom surface 150b of the insulating gapfill pattern 150 therein to be positioned at a lower level than that of the bottom level UPB of the upper portion UP of the lower semiconductor pattern LSP.

An upper portion of each of the channel structures CS may have a first thickness T1, when measured in a direction parallel to the top surface of the substrate 100. In other words, a sum in thickness of the first and second semiconductor pillars SP1 and SP2 may be the first thickness T1. The lower portion of each of the channel structures CS may have a second thickness T2, when measured in a direction parallel to the top surface of the substrate 100. In other words, the thickness of the second semiconductor pillar SP2 in contact with the vertical insulator 145 may be the second thickness T2. Here, the second thickness T2 may be less than the first thickness T1; for example, the second thickness T2 may be about 10-40% of the first thickness T1.

In the case where the second semiconductor pillar SP2 in contact with the vertical insulator 145 has a relatively small thickness (e.g., the second thickness T2), a grain size of the second semiconductor pillar SP2 may be reduced. The reduction in the grain size of the second semiconductor pillar SP2 may make it possible to shorten a path length of electrons and reduce a density of trap sites. As a result, it is possible to increase electron mobility on a channel region and improve electric characteristics of the semiconductor device.

As an example, the first and second semiconductor pillars SP1 and SP2 may be in an undoped state or may be doped to have the same conductivity type as the substrate 100. The first and second semiconductor pillars SP1 and SP2 may have a poly-crystalline structure or a mono-crystalline structure. As an example, the first and second semiconductor pillars SP1 and SP2 may be formed of or include silicon. The insulating gapfill pattern 150 may be formed of or include silicon oxide.

Conductive pads 137 may be provided to penetrate the stack SS and may be connected to the channel structures CS, respectively. A top surface of the conductive pad 137 may be substantially coplanar with that of the stack SS, and a bottom surface of the conductive pad 137 may be in contact with the channel structure CS. The vertical insulator 145 may extend in the third direction D3 and may be interposed between the conductive pad 137 and the insulating layer 110 adjacent thereto. The conductive pad 137 may include a conductive material (e.g., at least one of doped semiconductor or metallic material).

Bit lines BIT may be provided on the stack SS to cross the stack SS. The bit lines BIT may be coupled to the conductive pads 137 through bit line plugs BPLG.

FIGS. 4 to 8, 10, and 12 to 15 are sectional views illustrating a method of fabricating a three-dimensional semiconductor memory device according to some embodiments of the inventive concept. FIGS. 9 and 11 are enlarged views illustrating portions 'M' of FIGS. 8 and 10, respectively.

Figure 4:
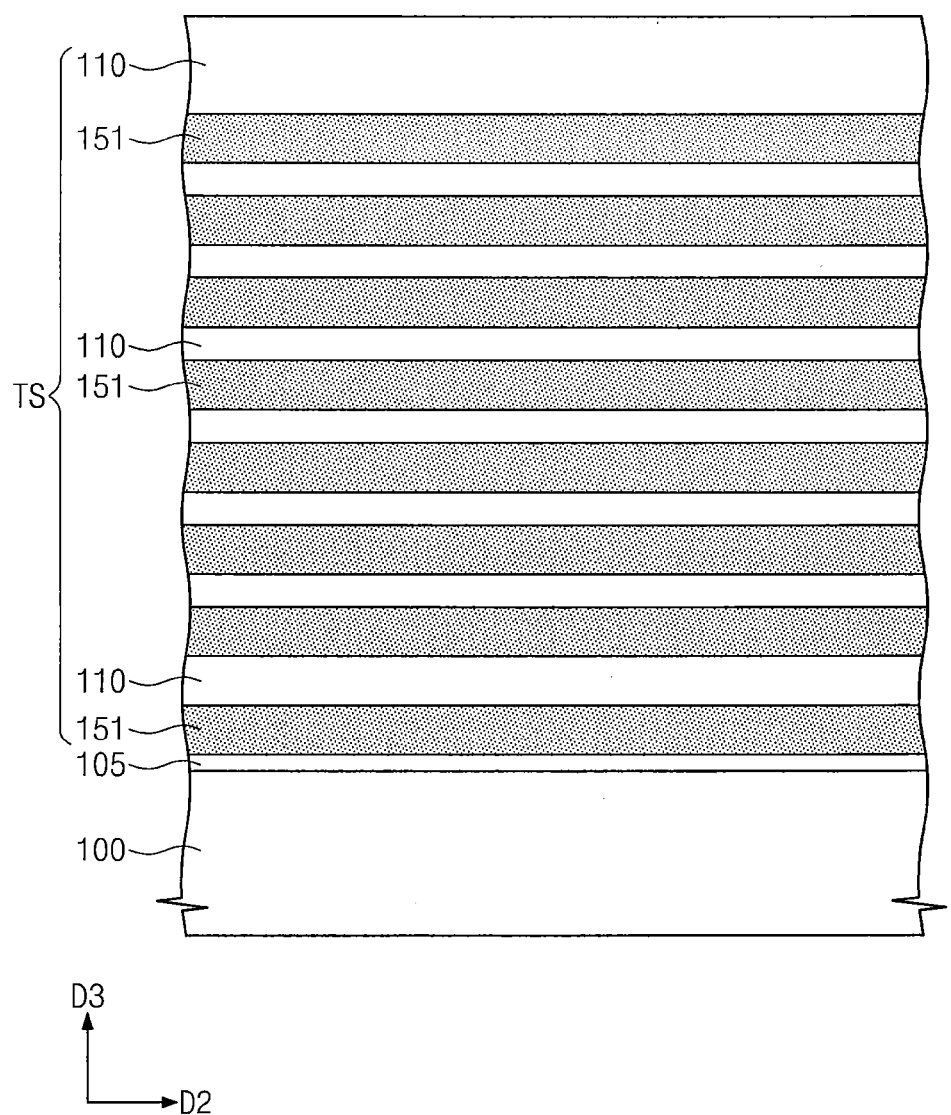
FIGS. 4 to 8, 10, and 12 to 15 are sectional views illustrating a method of fabricating a three-dimensional semiconductor memory device according to some embodiments of the inventive concept.

Referring to FIG. 4, sacrificial layers 151 and insulating layers 110 may be alternately and repeatedly deposited on the substrate 100 to form a layered structure TS. The substrate 100 may be a silicon substrate, a germanium substrate, or a silicon-germanium substrate.

The sacrificial layers 151 may be formed to have substantially the same thickness. However, in certain embodiments, the lowermost and uppermost ones of the sacrificial layers 151 may be formed to have a thickness greater than that of the others provided therebetween. The insulating layers 110 may be formed to have the substantially same thickness, but in certain embodiments, some of the insulating layers 110 may be formed to have a thickness different from that of the others.

For example, the sacrificial layers 151 may be formed of a silicon nitride layer, a silicon oxynitride layer, or a silicon layer. The insulating layers 110 may be formed of a silicon oxide layer. The sacrificial layers 151 and the insulating layers 110 may be deposited using, for example, a thermal chemical vapor deposition process, a plasma-enhanced chemical vapor deposition (PE-CVD) process, a physical CVD process, or an atomic layer deposition (ALD) process.

Furthermore, a lower insulating layer 105 may be formed between the substrate 100 and the layered structure TS. The lower insulating layer 105 may be formed of a material having a high etch selectivity with respect to the sacrificial layers 151 and the insulating layers 110. The lower insulating layer 105 may include a silicon nitride layer or a high-k dielectric layer (e.g., aluminum oxide or hafnium oxide). The lower insulating layer 105 may be formed to have a thickness less than those of the sacrificial layers 151 and the insulating layers 110.

Figure 5:
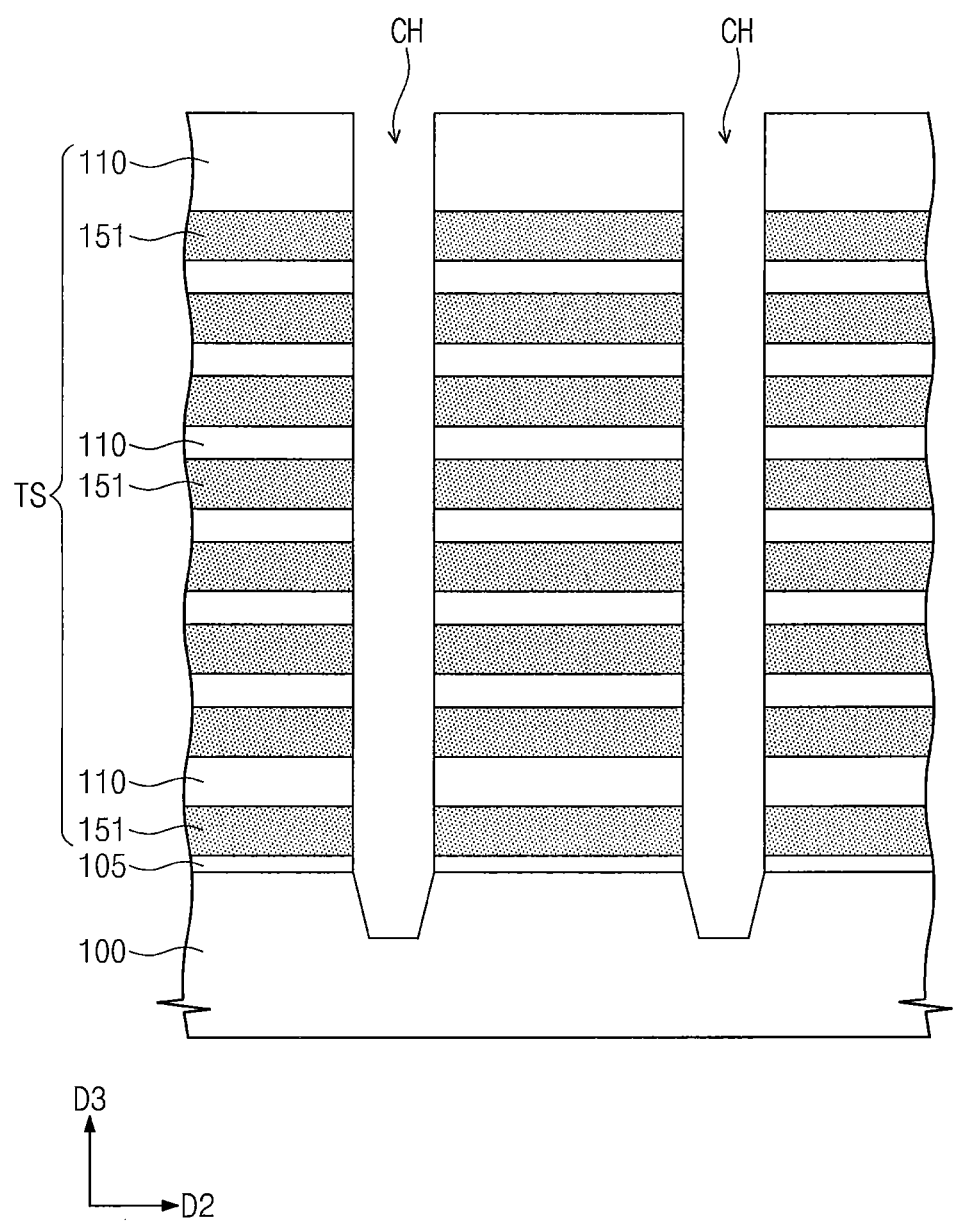

Referring to FIG. 5, channel holes CH may be formed to penetrate the layered structure TS and thereby to expose the substrate 100. The channel holes CH may be formed to have the same arrangement as the channel structures CS described with reference to FIG. 2.

The formation of the channel holes CH may include forming a first mask pattern on the layered structure TS to have openings defining positions and shapes of the channel holes CH and etching the layered structure TS using the first mask pattern as an etch mask. The etching process may be performed to etch the top surface of the substrate 100 in an over-etching manner, and thus, the top surface of the substrate 100 may be partially recessed. Thereafter, the first mask patterns may be removed.

Figure 6:
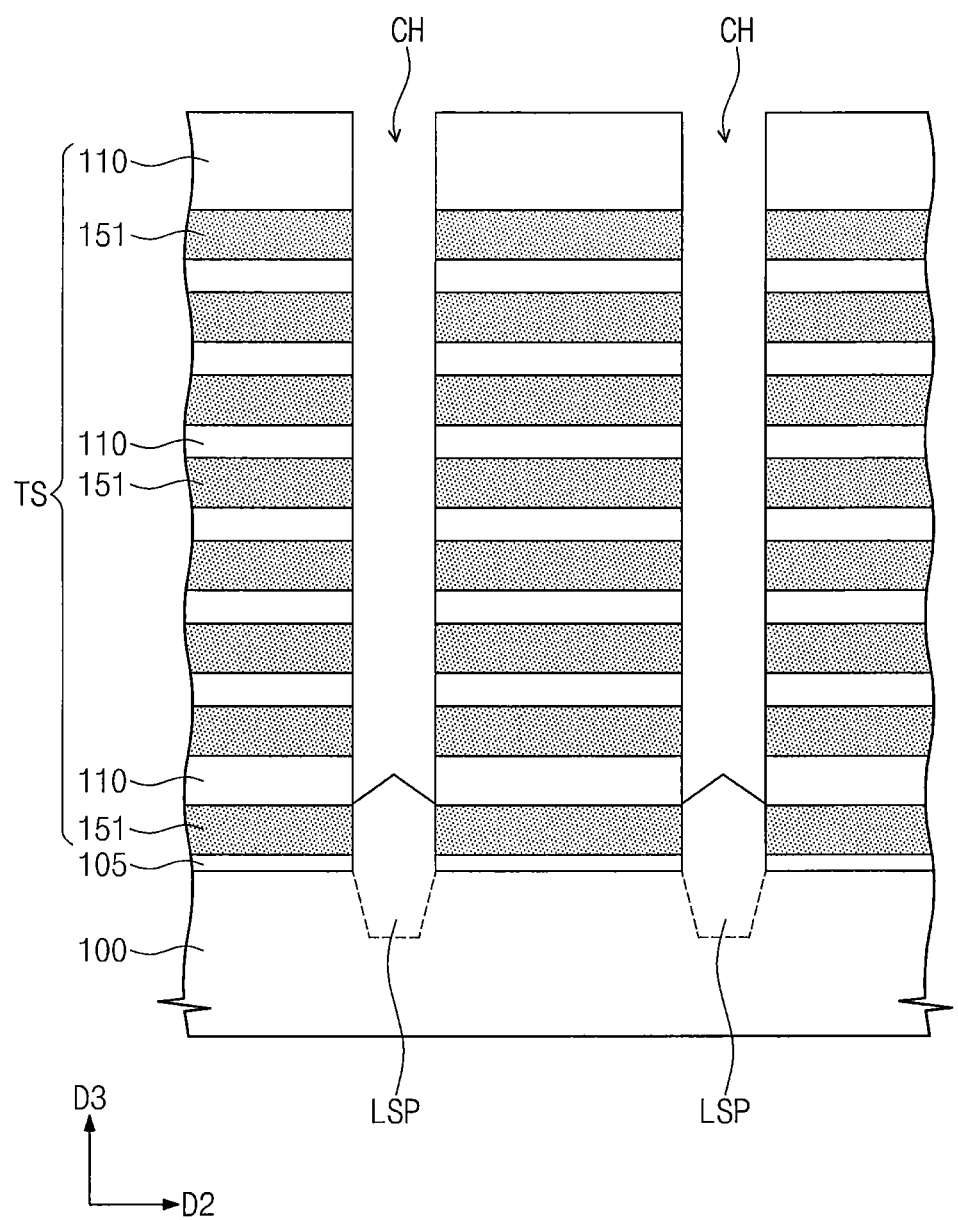

Referring to FIG. 6, lower semiconductor patterns LSP may be formed to fill lower regions of the channel holes CH, respectively. The lower semiconductor patterns LSP may be formed by a selective epitaxial growth (SEG) process, in which the substrate 100 exposed by the channel holes CH is used as a seed layer. In this case, the lower semiconductor patterns LSP and the substrate 100 may be continuously connected to each other, thereby forming a single semiconductor structure.

Each of the lower semiconductor patterns LSP may be a pillar-shaped structure that protrudes upward from the top surface of the substrate 100 and fills a corresponding one of the lower regions of the channel holes CH. The lower semiconductor pattern LSP may be formed to cover a sidewall of the lowermost one of the sacrificial layers 151. The lower semiconductor pattern LSP may be formed to have a top surface that is positioned between bottom and top surfaces of the lowermost one of the insulating layers 110.

As a result of the SEG process, each of the lower semiconductor patterns LSP may be formed to have an upward convex top surface. For example, the lower semiconductor pattern LSP may have an upper portion having a gradually decreasing width in a third direction D3.

The lower semiconductor patterns LSP may be formed of or include a semiconductor material, whose conductivity type is the same as that of the substrate 100. The lower semiconductor patterns LSP may be doped with impurities in situ during the selective epitaxial growth process. Alternatively, after the selective epitaxial growth process, the lower semiconductor patterns LSP may be doped by an ion injection process. The lower semiconductor patterns LSP may have a mono- or poly-crystalline structure; for example, the lower semiconductor patterns LSP may be formed of a mono- or poly-crystalline silicon layer.

Figure 7:
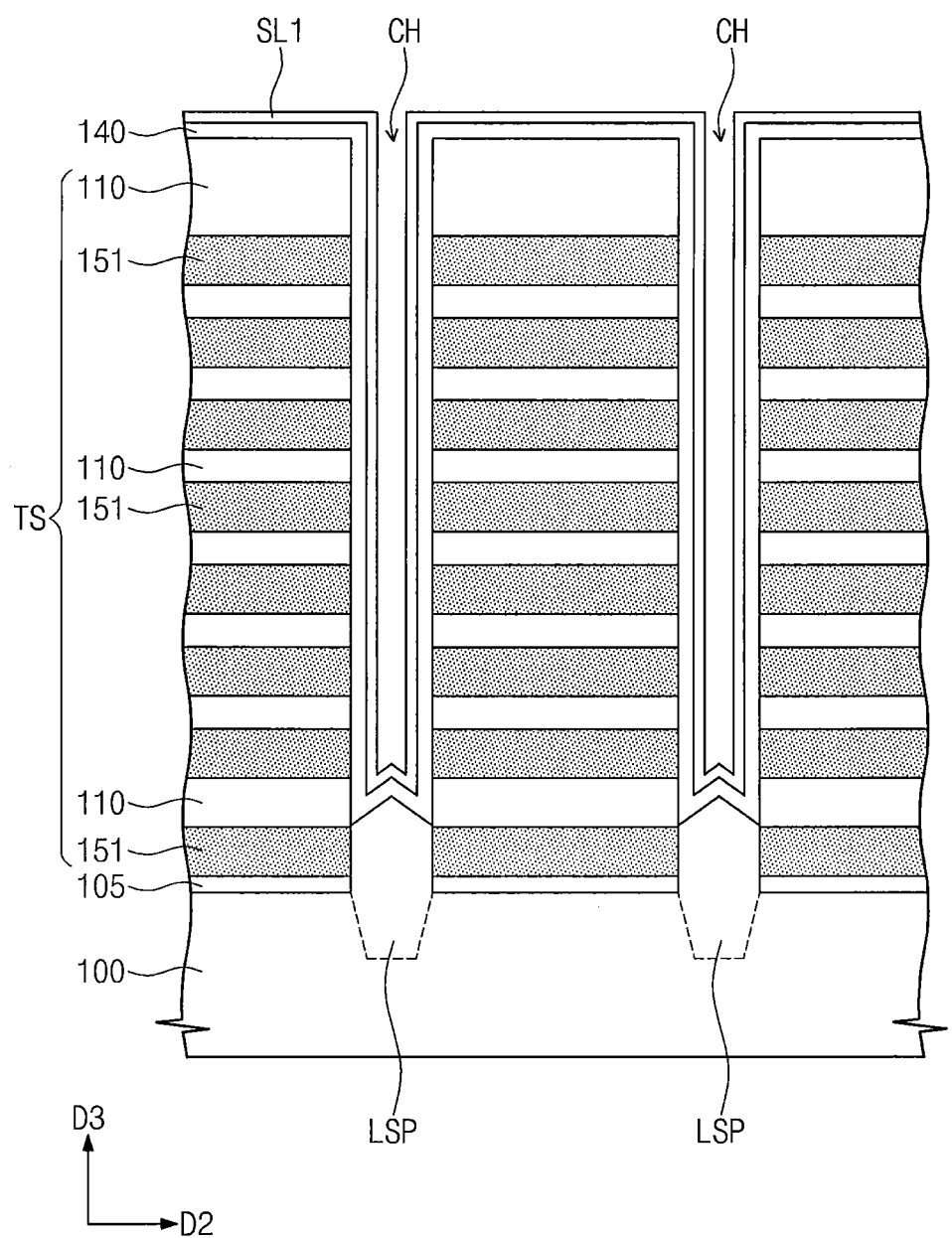

Referring to FIG. 7, a vertical insulating layer 140 and a first semiconductor layer SL1 may be sequentially formed on inner sidewalls of the channel holes CH. The vertical insulating layer 140 and the first semiconductor layer SL1 may be formed to partially fill each of the channel holes CH. That is, the whole region of the channel hole CH may not be filled with the vertical insulating layer 140 and the first semiconductor layer SL1. The vertical insulating layer 140 may be formed to cover the top surface of the lower semiconductor pattern LSP exposed by the channel hole CH. Accordingly, the vertical insulating layer 140 and the first semiconductor layer SL1 may have lower portions, which extend parallel to the top surface of the lower semiconductor pattern LSP and have an inclined profile.

In detail, the formation of the vertical insulating layer 140 may include sequentially forming a blocking insulating layer BL, a charge storing layer CL, and a tunnel insulating layer TL on the inner sidewall of each of the channel holes CH (for example, see FIG. 9). The blocking insulating layer BL may be formed of or include at least one of a silicon oxide layer, a silicon nitride layer, or a silicon oxynitride layer. The charge storing layer CL may be formed of or include at least one of a silicon nitride layer, a silicon oxynitride layer, a silicon-rich nitride layer, a nanocrystalline silicon layer, or a laminated trap layer. The tunnel insulating layer TL may be formed of or include a silicon oxide layer. Each of the blocking insulating layer BL, the charge storing layer CL, and the tunnel insulating layer TL may be deposited using, for example, a plasma-enhanced chemical vapor deposition (PE-CVD) process, a physical CVD process, or an atomic layer deposition (ALD) process.

The first semiconductor layer SL1 may have a polycrystalline structure or a mono-crystalline structure. As an example, the first semiconductor layer SL1 may be formed of a polysilicon layer, a single crystalline silicon layer, or an amorphous silicon layer. The first semiconductor layer SL1 may be formed using an ALD or CVD process.

Figure 8:
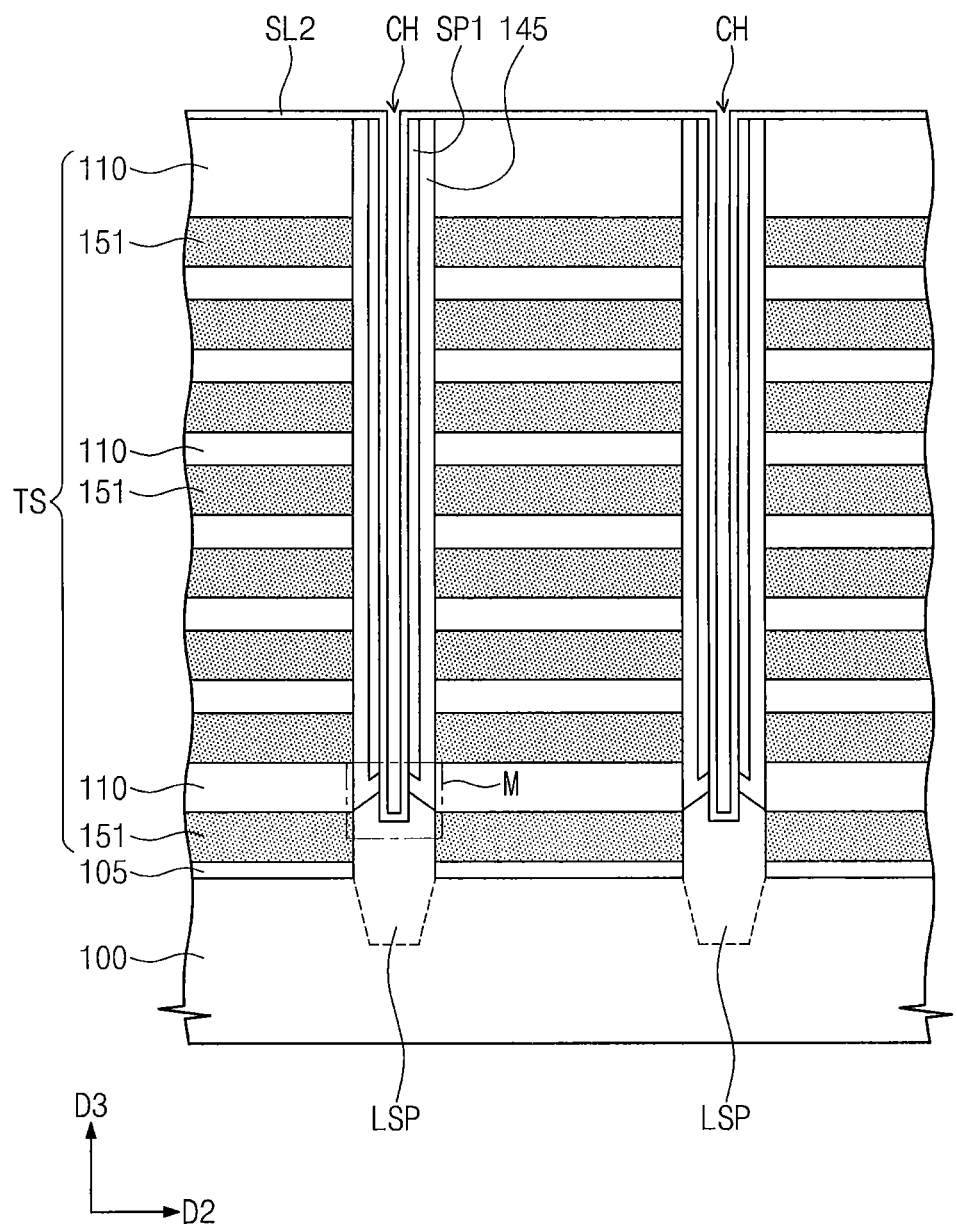
Figure 9:
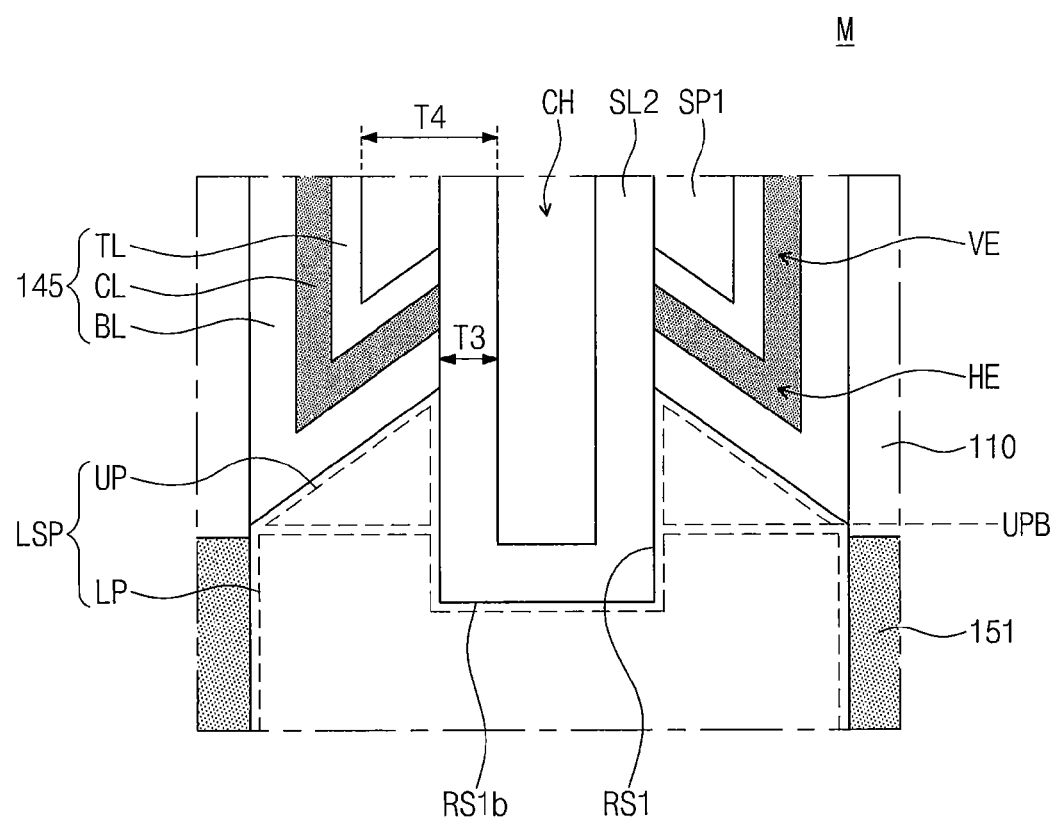
FIGS. 9 and 11 are enlarged views illustrating portions 'M' of FIGS. 8 and 10, respectively.

Referring to FIGS. 8 and 9, the first semiconductor layer SL1 and the vertical insulating layer 140 may be anisotropically etched, and as a result, a first semiconductor pillar SP1 and a vertical insulator 145 may be formed in each of the channel holes CH. Each of the first semiconductor pillar SP1 and the vertical insulator 145 may be a pipe-shaped or macaroni-shaped structure with open top and bottom. Accordingly, the first semiconductor pillar SP1 and the vertical insulator 145 may be formed to expose a portion of the lower semiconductor pattern LSP.

The anisotropic etching process may be performed to etch the first semiconductor layer SL1 and the vertical insulating layer 140 in an over-etching manner, and thus, first recess regions RS1 may be formed in the lower semiconductor patterns LSP, respectively.

Referring back to FIG. 9, the first recess region RS1 may be formed in such a way that its bottom RS1b is lower than a bottom level UPB of an upper portion UP of the lower semiconductor pattern LSP. As appreciated by the present inventive entity, where the convex (or sloped surface) of the upper portion UP begins, if the anisotropic etching process is not performed in the over-etching manner, it may be difficult to expose the lower semiconductor pattern LSP in the process of etching the first semiconductor layer SL1 and/or the vertical insulating layer 140. Otherwise, the lower semiconductor pattern LSP may be electrically disconnected from the channel structure CS, so that the semiconductor device may not operate normally. As appreciated by the present inventive entity, by contrast, according to some embodiments of the inventive concept, a process condition capable of achieving higher anisotropy and higher etch rate may be used for the anisotropic etching process; that is, the anisotropic etching process may be performed under an enhanced over-etching condition. Accordingly, the first recess region RS1 may be formed to completely penetrate the upper portion UP of the lower semiconductor pattern LSP, and as a result, the lower semiconductor pattern LSP may be reliably exposed.

Referring back to FIGS. 8 and 9, a second semiconductor layer SL2 may be formed in the channel holes CH. The second semiconductor layer SL2 may be too thin to fill the whole interior spaces of the channel holes CH and may be conformally formed in the channel holes CH. For example, the second semiconductor layer SL2 may be formed to have a third thickness T3. Here, a thickness sum of the first semiconductor pillar SP1 and the second semiconductor layer SL2 may be a fourth thickness T4.

The second semiconductor layer SL2 may be formed to electrically connect the substrate 100 to the first semiconductor pillar SP1. The second semiconductor layer SL2 may have a poly-crystalline structure or a mono-crystalline structure. As an example, the second semiconductor layer SL2 may be formed of a polysilicon layer, a single crystalline silicon layer, or an amorphous silicon layer. The second semiconductor layer SL2 may be formed by an ALD or CVD process.

Figure 10:
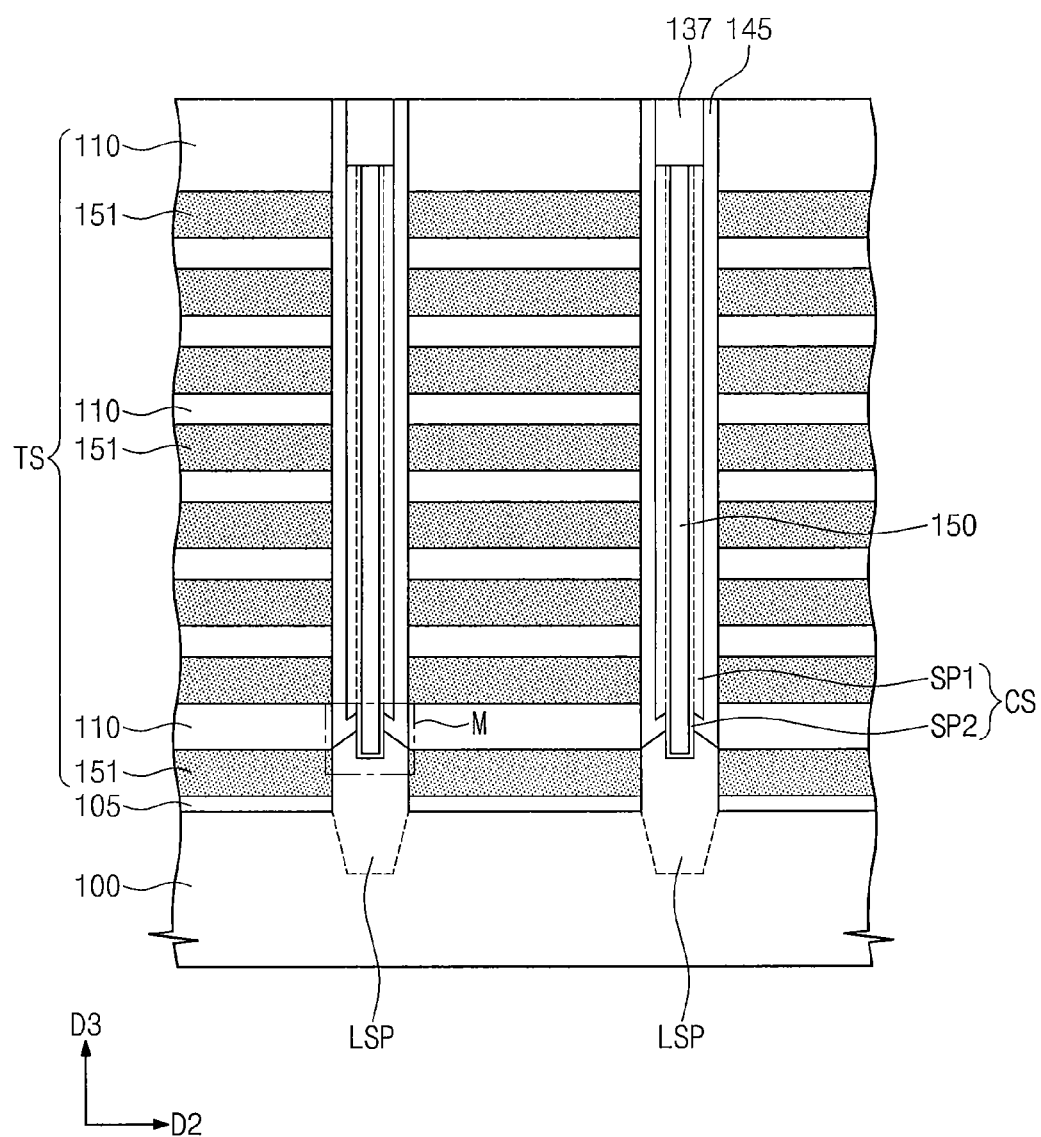
Figure 11:
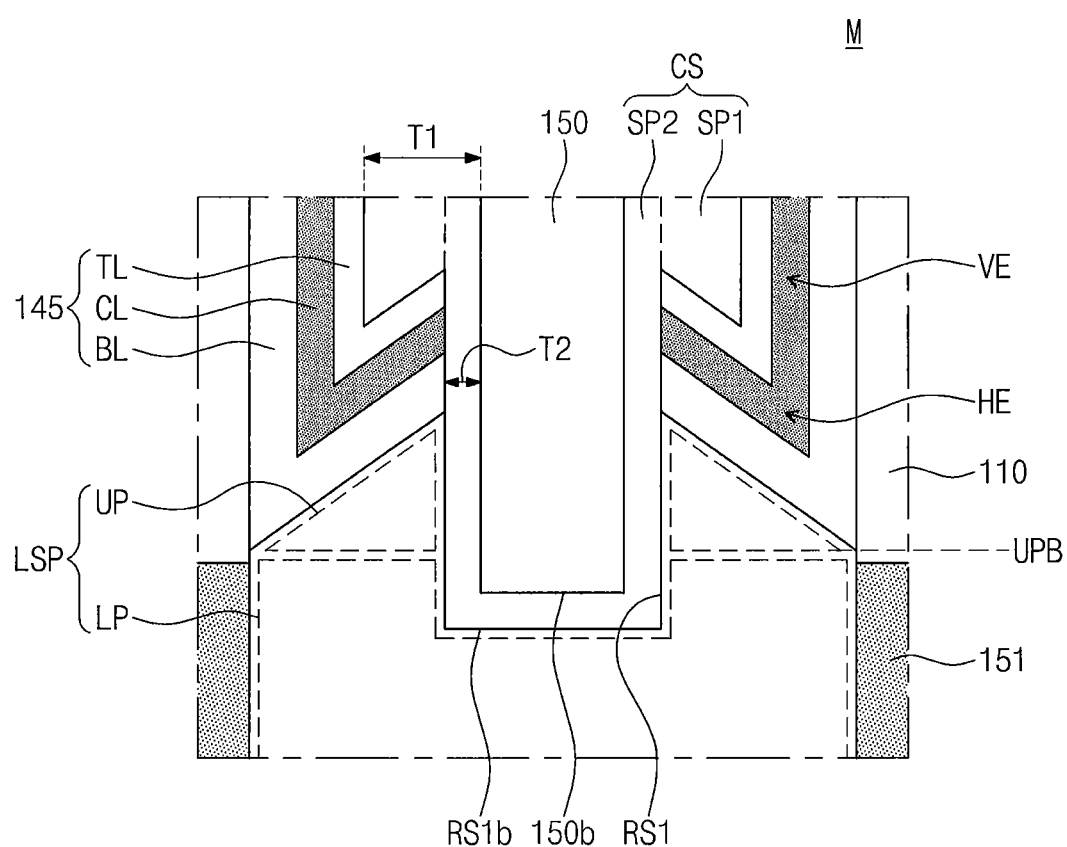

Referring to FIGS. 10 and 11, a cleaning process may be performed on the second semiconductor layer SL2, and then, an insulating gapfill layer may be formed to completely fill the channel holes CH. The insulating gapfill layer may be a silicon oxide layer, which is formed using a spin-on-glass (SOG) technology. Thereafter, the upper portions of the second semiconductor layer SL2 and the insulating gapfill layer may be recessed to form the second semiconductor pillar SP2 and the insulating gapfill pattern 150 in each of the channel holes CH. In some embodiments, the first semiconductor pillar SP1 may also be recessed during the recessing of the second semiconductor layer SL2. The first and second semiconductor pillars SP1 and SP2 may constitute a channel structure CS.

In the channel hole CH, the second semiconductor pillar SP2 may have a pipe-shaped or hollow-cylindrical structure with a closed one end; for example, the second semiconductor pillar SP2 may be shaped like a cup. The insulating gapfill pattern 150 may be a rod-shaped structure filling the channel hole CH provided with the second semiconductor pillar SP2.

Furthermore, conductive pads 137 may be formed on and connected to the channel structures CS, respectively. The conductive pads 137 may be formed by filling the recessed regions of the channel structures CS and the insulating gapfill patterns 150 with a conductive material. As an example, the conductive pads 137 may be formed of a silicon layer, which is doped to have the same conductivity type as the substrate 100. A planarization process may be performed on a top portion of the layered structure TS.

Referring back to FIG. 11, the cleaning process may be performed on the second semiconductor layer SL2 to reduce the thickness (e.g., the thickness T3) of the second semiconductor layer SL2. For example, the second semiconductor pillar SP2 may have a second thickness T2 that is smaller than the third thickness T3 as a result of the process described in reference to FIGS. 10 and 11.

In some embodiments, the cleaning process may be a standard cleaning 1 (SC) process. For example, the cleaning process may be performed using a cleaning solution, in which ammonium hydroxide and hydrogen peroxide are mixed. In this case, an exposed portion of the second semiconductor layer SL2 may be oxidized during the cleaning process, and then, the oxidized portion of the second semiconductor layer SL2 may be removed. That is, the thickness of the second semiconductor layer SL2 may be reduced by the cleaning process.

According to some embodiments of the inventive concept, the first recess region RS1 may be deeply formed by the over-etching process, and this may make it possible to completely expose a portion of the second semiconductor layer SL2 in contact with the vertical insulator 145. Accordingly, the portion of the second semiconductor layer SL2 in contact with the vertical insulator 145 may be more easily exposed to the cleaning solution, when the cleaning process is performed. That is, as a result of the cleaning process, the portion of the second semiconductor layer SL2 in contact with the vertical insulator 145 may have a reduced thickness (e.g., the second thickness T2).

A thickness sum of the first and second semiconductor pillars SP1 and SP2 may be a first thickness T1. Here, the second semiconductor pillar SP2 may be formed to have the thickness T2, which is much less than the thickness of the first semiconductor pillar SP1; for example, the second thickness T2 may be about 10%-40% of the first thickness T1.

The insulating gapfill pattern 150 may have a bottom surface 150b that is adjacent to the bottom RS1b of the first recess region RS1. For example, the bottom surface 150b of the insulating gapfill pattern 150 may be lower than the bottom level UPB of the upper portion UP of the lower semiconductor pattern LSP.

Figure 12:
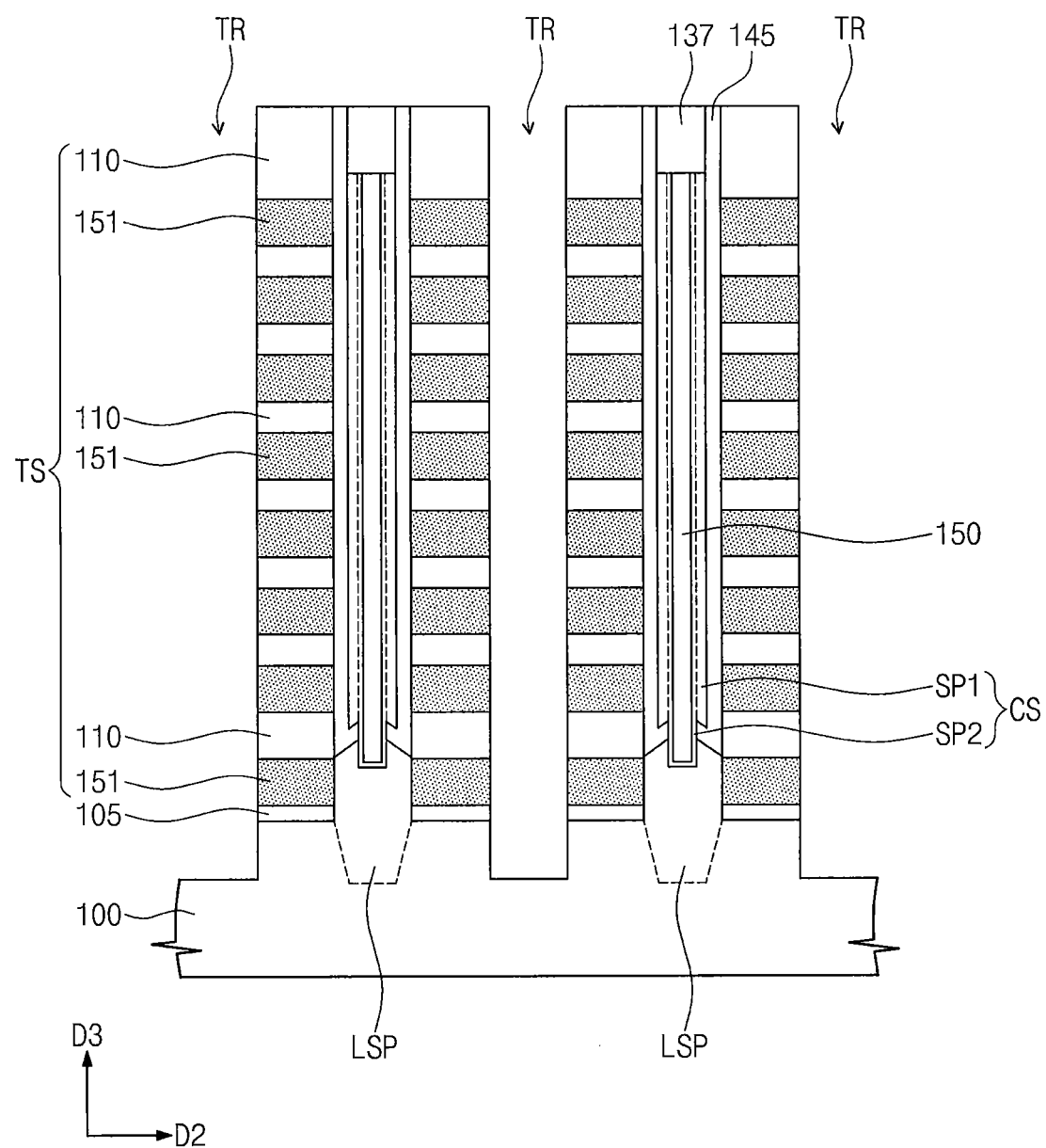

Referring to FIG. 12, the layered structure TS may be patterned to form trenches TR, each of which is provided between the channel structures CS to expose a portion of the substrate 100. For example, the formation of the trenches TR may include forming second mask patterns (not shown) on the layered structure TS to define positions and shapes of the trenches TR, and then, etching the layered structure TS using the second mask patterns as an etch mask. The process of etching the layered structure TS may be performed in an over-etching manner. For example, the process of etching the layered structure TS may be performed to partially recess the top surface of the substrate 100. Thereafter, the second mask patterns may be removed.

The trenches TR may be formed to expose sidewalls of the sacrificial layers 151 and the insulating layers 110. Furthermore, the trenches TR may be formed to expose a sidewall of the lower insulating layer 105.

As a result of the formation of the trenches TR, the layered structure TS may be divided into a plurality of line-shaped portions, each of which extends parallel to the trenches TR. In some embodiments, a plurality of the channel structures CS may be provided to penetrate each of the line-shaped portions of the layered structure TS.

Figure 13:
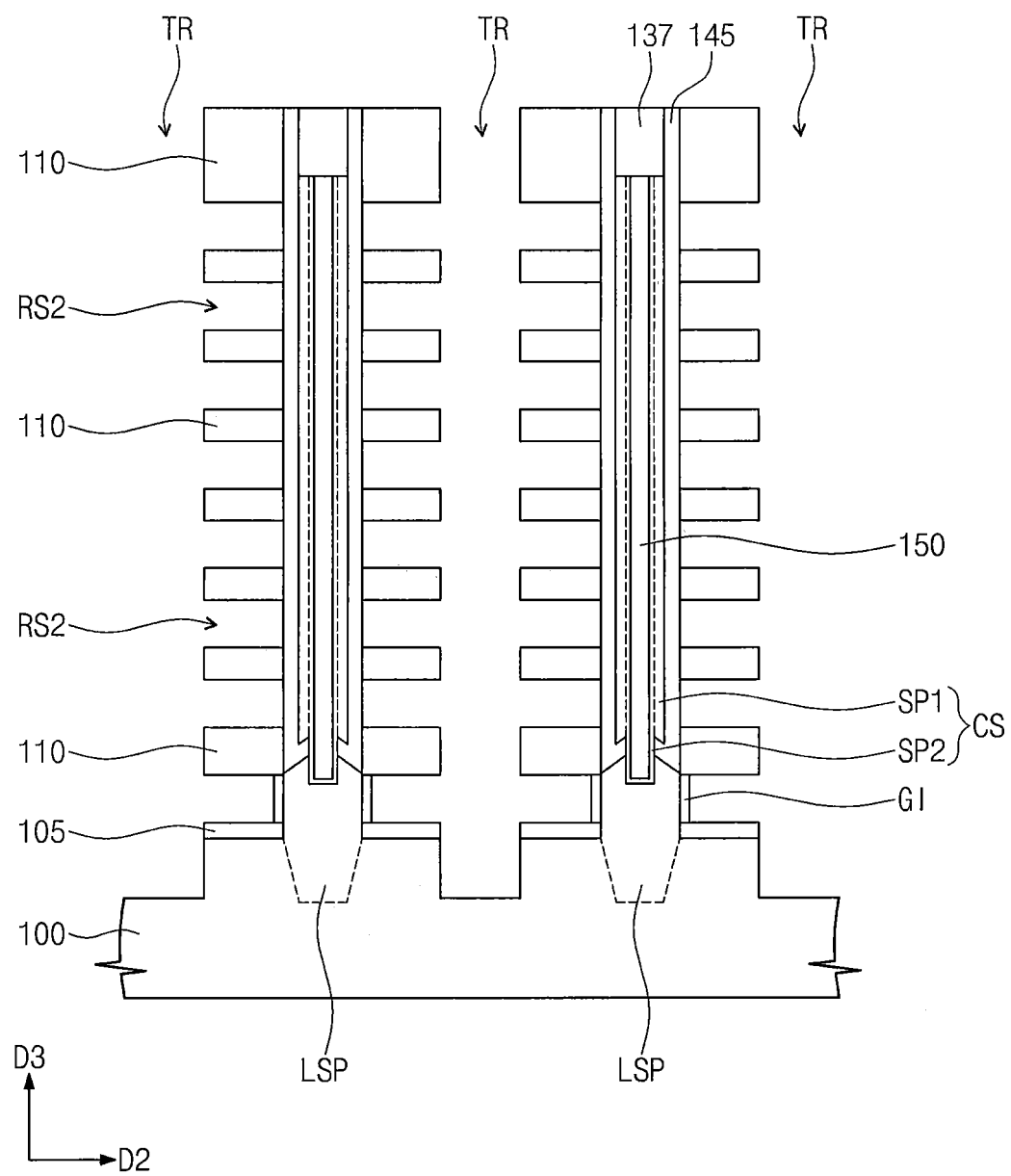

Referring to FIG. 13, the sacrificial layers 151 exposed by the trenches TR may be selectively removed to form second recess regions RS2. The second recess regions RS2 may be empty spaces, from the sacrificial layers 151 are removed. In the case where the sacrificial layers 151 include a silicon nitride layer or a silicon oxynitride layer, the process of removing the sacrificial layers 151 may be performed using an etching solution containing phosphoric acid. The second recess regions RS2 may be formed to partially expose the vertical insulator 145. In addition, the second recess regions RS2 may be formed to partially expose a side surface of the lower semiconductor pattern LSP.

A gate insulating layer GI may be formed to cover the exposed side surface of the lower semiconductor patterns LSP. For example, an oxidation process may be performed to form an oxide layer (i.e., the gate insulating layers GI) on the exposed side surface of the lower semiconductor patterns LSP.

Figure 14:
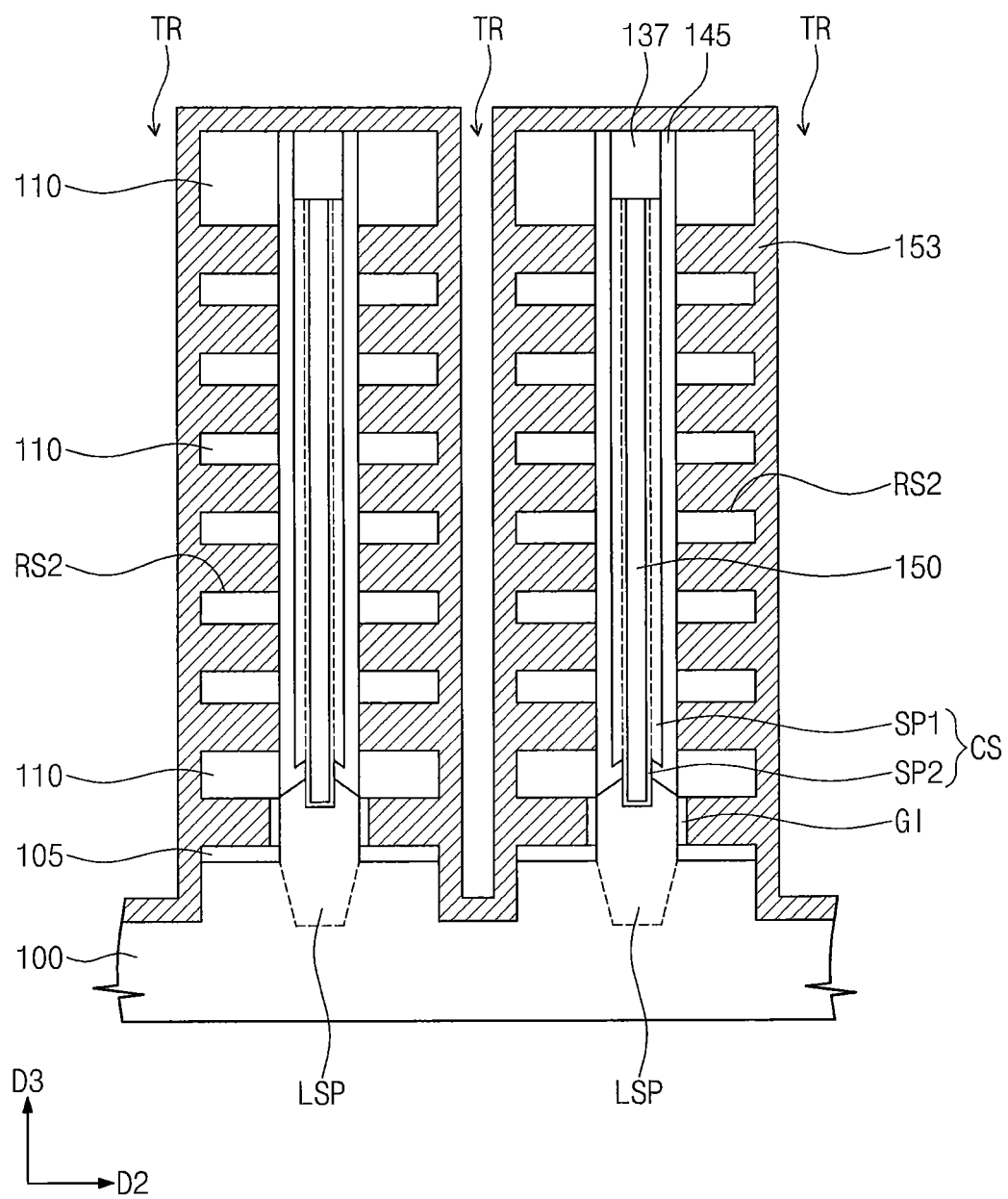

Referring to FIG. 14, a conductive layer 153 may be conformally formed to fill the second recess regions RS2. The conductive layer 153 may be formed of or include at least one of a doped polysilicon layer, a metal layer (e.g., tungsten), or a metal nitride layer. In some embodiments, the conductive layer 153 may be formed in such a way that the whole region of each of the trenches TR is not filled with the conductive layer 153.

Figure 15:
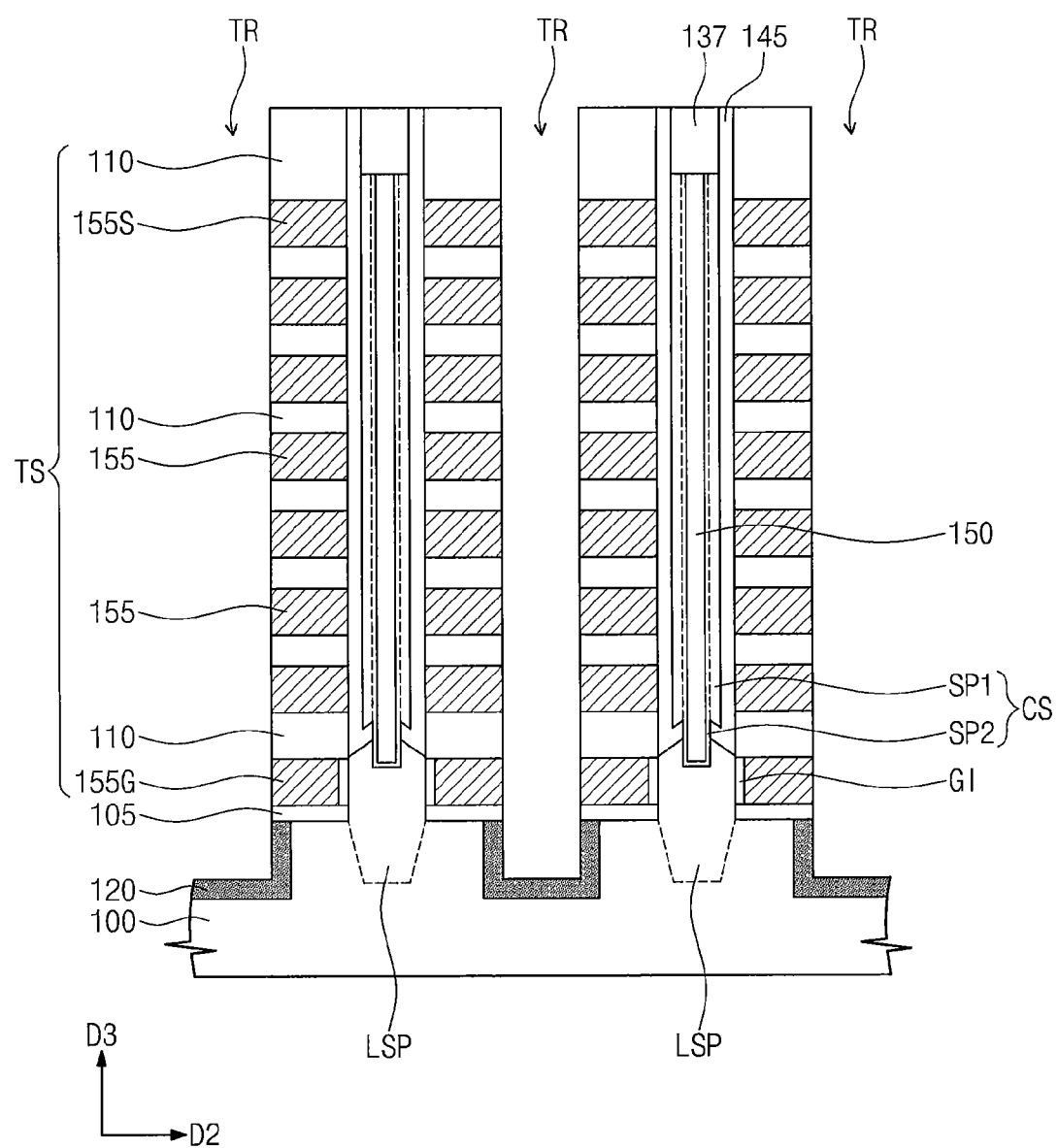

Referring to FIG. 15, an etching process may be performed to remove portions of the conductive layer 153 from the trenches TR and maintain other portions (i.e., limiting portions) of the conductive layer 153 in the second recess regions RS2. The remaining portions of the conductive layer 153 in the second recess regions RS2 may be used as gate electrodes 155. The gate electrodes 155 and the insulating layers 110 may be stacked on the substrate 100, thereby forming a stack SS.

After the formation of the gate electrodes 155, common source regions 120 may be formed in the substrate 100. The common source regions 120 may be formed by an ion implantation process and may be formed in the substrate 100 exposed by the trenches TR. The common source regions 120, in conjunction with the substrate 100, may provide pn junctions.

Referring back to FIG. 2, bit line plugs BPLG may be formed on and connected to the conductive pads 137, respectively, and bit lines BIT may be formed on and connected to the bit line plugs BPLG. The bit line BIT may be electrically connected to the channel structures CS through the bit line plugs BPLG.

Figure 16:
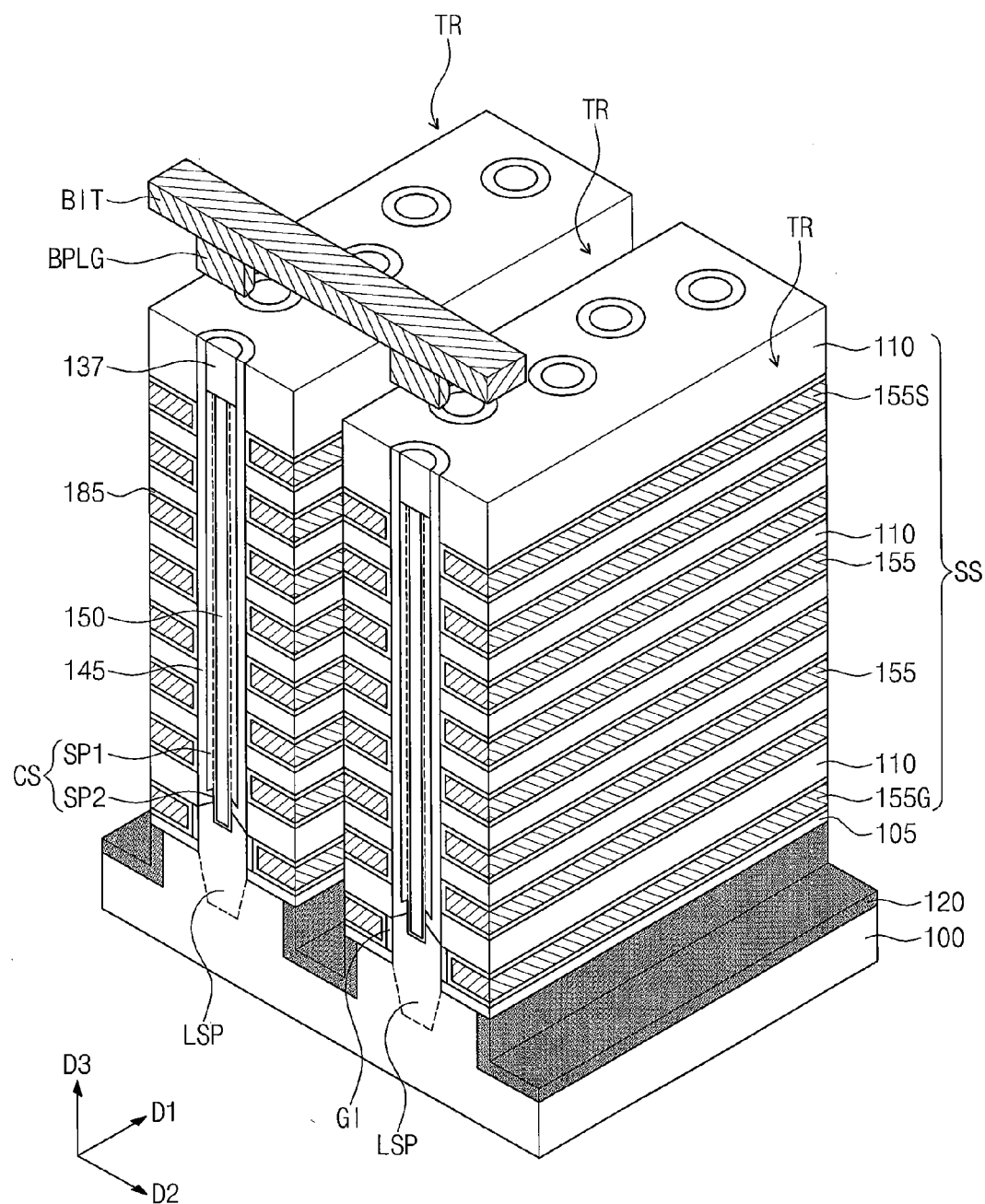
FIG. 16 is a perspective view illustrating a three-dimensional semiconductor memory device according to some embodiments of the inventive concept.

FIG. 16 is a perspective view illustrating a three-dimensional semiconductor memory device according to some embodiments of the inventive concept. In the following description of the present embodiment, an element previously described with reference to FIGS. 2 and 3 may be identified by a similar or identical reference number without repeating an overlapping description thereof.

Referring to FIG. 16, horizontal insulators 185 may be interposed between the gate electrodes 155 and the vertical insulator 145. Each of the horizontal insulators 185 may be horizontally extended to have a portion interposed between the gate electrode 155 and the insulating layer 110. Accordingly, each of the horizontal insulators 185 may have a 'U'-shaped section.

As described with reference to FIG. 3, the vertical insulator 145 may include the charge storing layer CL and the tunnel insulating layer TL. In some embodiments, unlike that described with reference to FIG. 3, the vertical insulator 145 may be formed not to include the blocking insulating layer BL. In this case, the horizontal insulator 185 may include the blocking insulating layer.

As another example, the vertical insulator 145 may include the tunnel insulating layer TL, as described with reference to FIG. 3. However, unlike that described with reference to FIG. 3, the vertical insulator 145 may be formed not to include the charge storing layer CL and the blocking insulating layer BL. In this case, the horizontal insulator 185 may include the blocking insulating layer and the charge storing layer.

Figure 17:
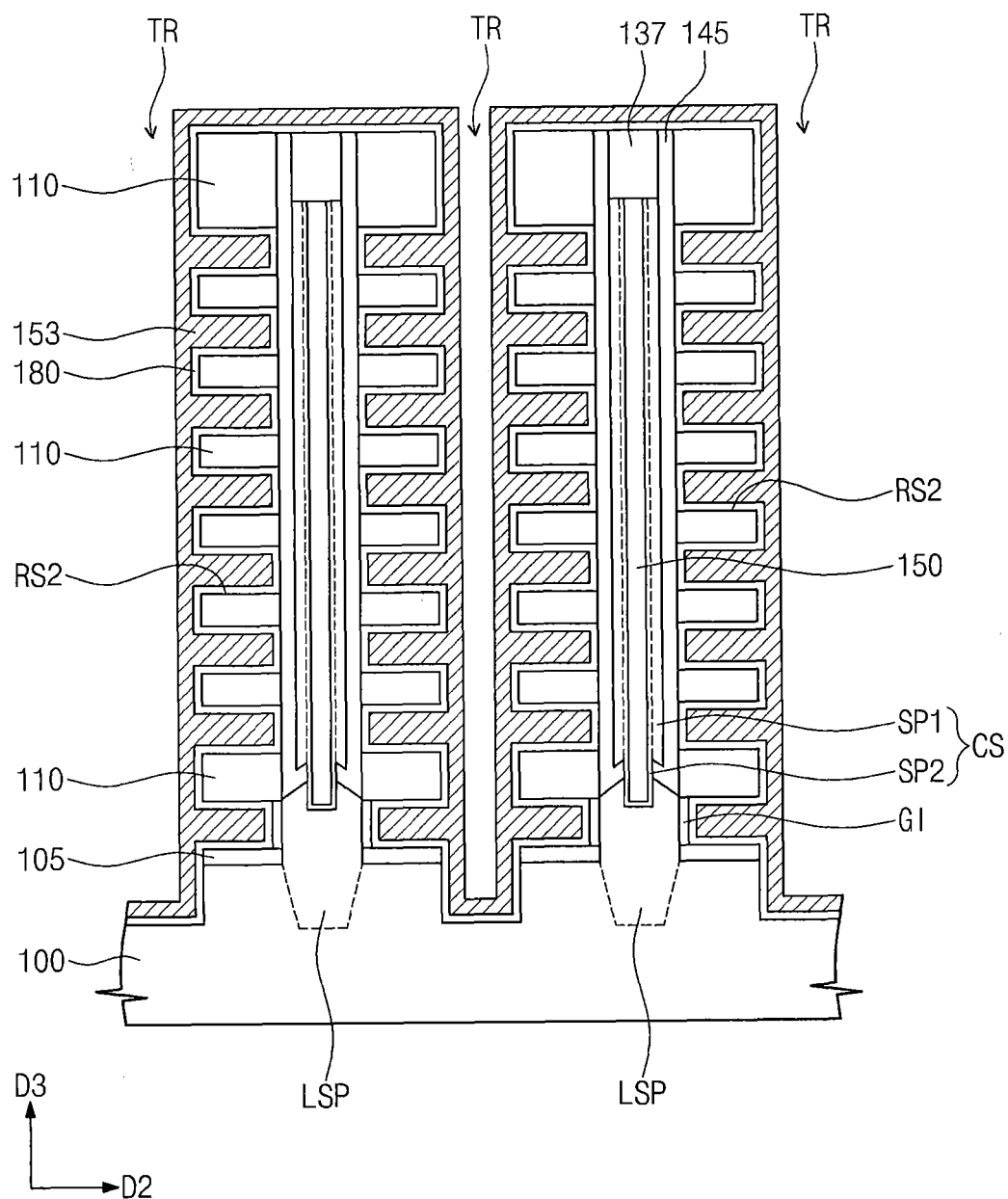
FIG. 17 is a sectional view illustrating a method of fabricating a three-dimensional semiconductor memory device according to some embodiments of the inventive concept.

FIG. 17 is a sectional view illustrating a method of fabricating a three-dimensional semiconductor memory device according to some embodiments of the inventive concept. In the following description of the present embodiment, an element or step previously described with reference to FIGS. 4 to 15 may be identified by a similar or identical reference number without repeating an overlapping description thereof.

Referring to FIG. 17, a horizontal insulating layer 180 may be conformally formed on the structure of FIG. 13. The horizontal insulating layer 180 may be formed to conformally cover inner surfaces of the second recess regions RS2. The horizontal insulating layer 180 may be deposited using, for example, a plasma-enhanced chemical vapor deposition (PE-CVD) process, a physical CVD process, or an atomic layer deposition (ALD) process. Thereafter, the conductive layer 153 may be conformally formed to fill the remaining spaces of the second recess regions RS2.

Referring back to FIG. 16, an etching process may be performed to remove portions of the conductive layer 153 and the horizontal insulating layer 180 from the trenches TR while other portions of the conductive layer 153 remain along with the horizontal insulating layer 180 in the second recess regions RS2. The remaining portions of the conductive layer 153 and the horizontal insulating layer 180 in the second recess regions RS2 may be used as the horizontal insulator 185 and the gate electrodes 155.

After the formation of the gate electrodes 155, the common source regions 120 may be formed in the substrate 100. Next, the bit line plugs BPLG may be formed on and connected to the conductive pads 137, respectively, and the bit lines BIT may be formed on and connected to the bit line plugs BPLG.

Figure 18:
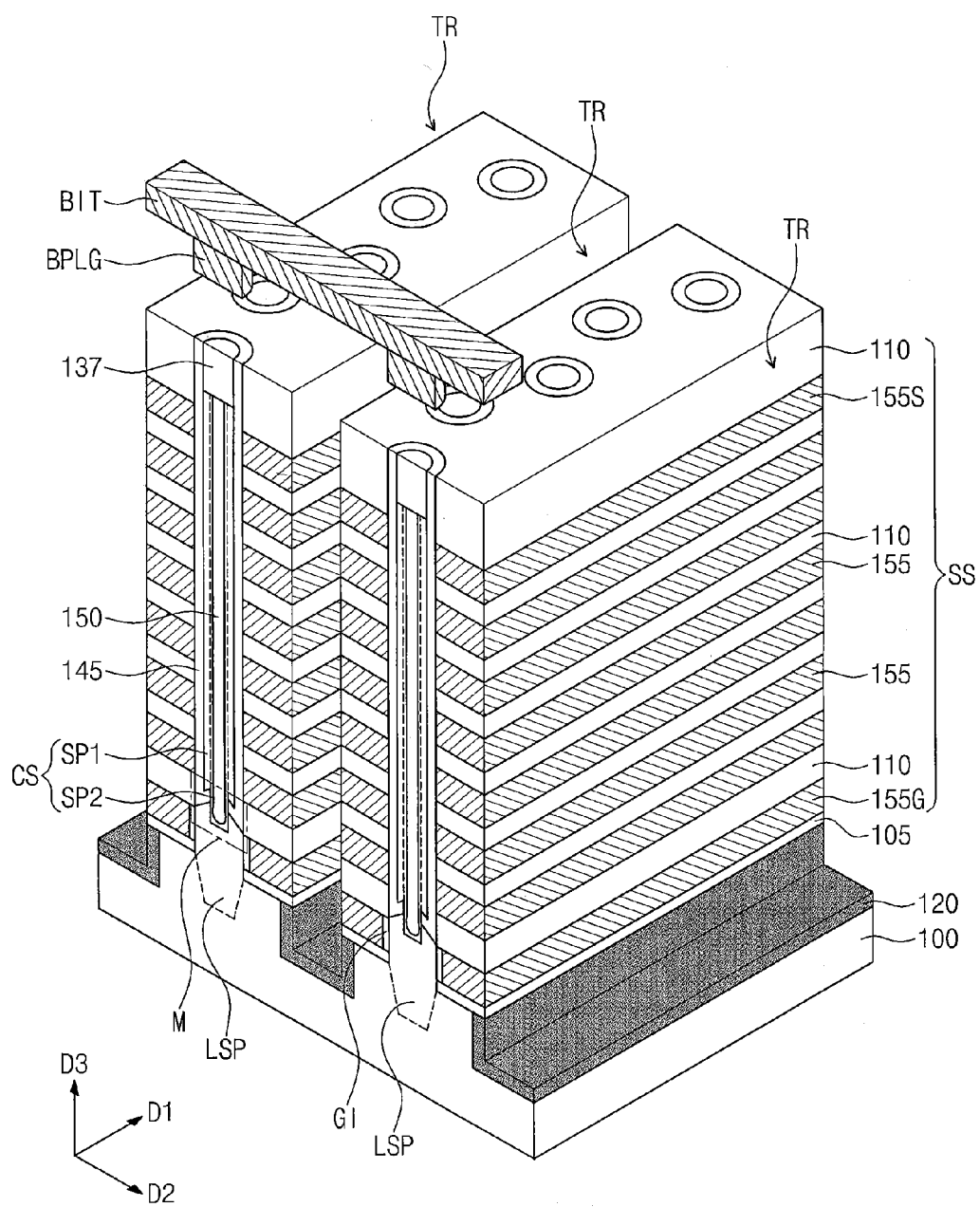
FIG. 18 is a perspective view illustrating a three-dimensional semiconductor memory device according to some embodiments of the inventive concept.
Figure 19:
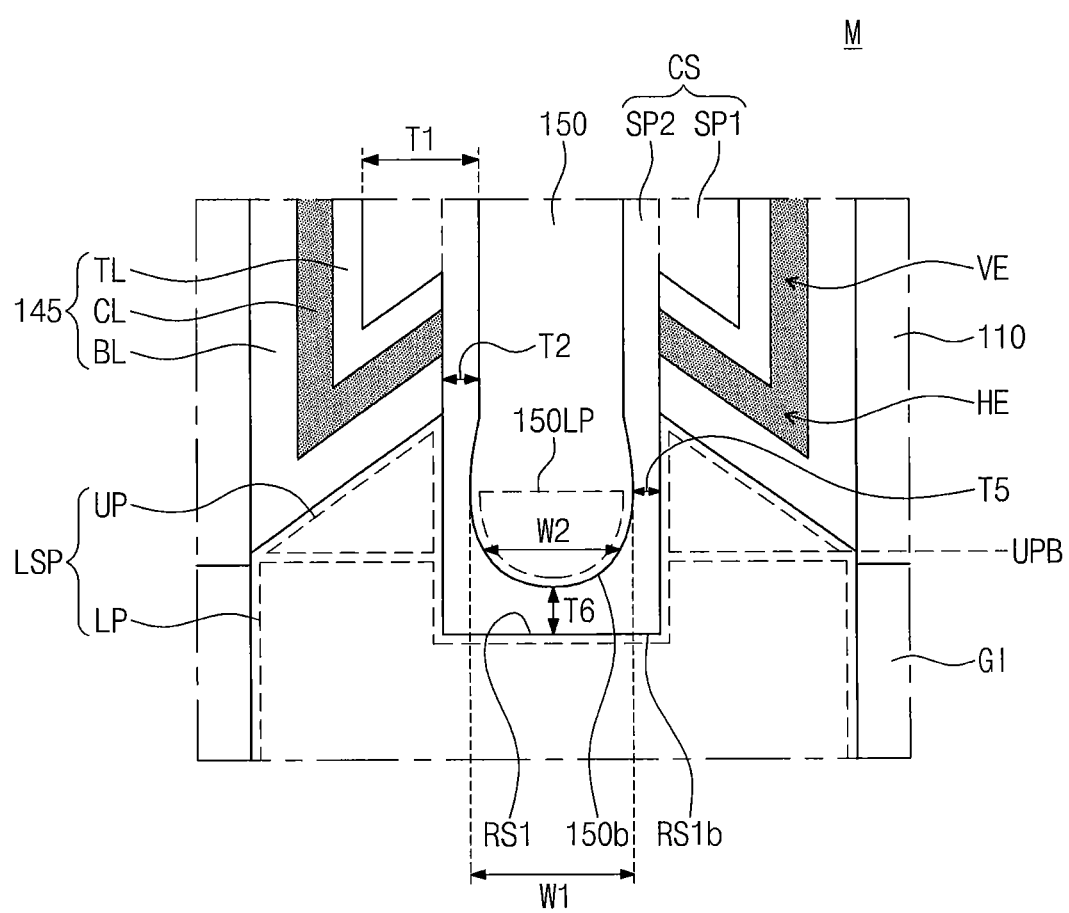
FIG. 19 is an enlarged sectional view of a portion 'M' of FIG. 18.

FIG. 18 is a perspective view illustrating a three-dimensional semiconductor memory device according to some embodiments of the inventive concept. FIG. 19 is an enlarged sectional view of a portion 'M' of FIG. 18. In the following description of the present embodiment, an element previously described with reference to FIGS. 2 and 3 may be identified by a similar or identical reference number without repeating an overlapping description thereof.

Referring to FIGS. 18 and 19, in each of the lower semiconductor patterns LSP, the first recess region RS1 may be formed to penetrate the upper portion UP of the lower semiconductor pattern LSP. The first recess region RS1 may be formed to have a non-planar bottom. The second semiconductor pillar SP2 may include the lower portion, which passes through the bottom of the first semiconductor pillar SP1 into the first recess region RS1. Accordingly, the second semiconductor pillar SP2 may allow the first semiconductor pillar SP1 to be electrically connected to the substrate 100 or the lower semiconductor pattern LSP.

The insulating gapfill pattern 150 in the second semiconductor pillar SP2 may have a curved shape in the first recess region RS1. For example, the bottom surface 150b of the insulating gapfill pattern 150 may have a curved shape (free of interior corners). The lowermost portion of the bottom surface 150b of the insulating gapfill pattern 150 may be lower than the bottom level UPB of the upper portion UP of the lower semiconductor pattern LSP.

A lower portion 150LP of the insulating gapfill pattern 150 may have a vertically-varying width. For example, the width of the lower portion 150LP may be maximum (e.g., of a first width W1) at a top level thereof and may gradually decrease with decreasing distance from the substrate 100. For example, at a level below the top level, the lower portion 150LP may have a second width W2 that is less than the first width W1.

In the first recess region RS1, the second semiconductor pillar SP2 may have a vertically-varying thickness. For example, the second semiconductor pillar SP2, may have a fifth thickness T5 at a region adjacent to a sidewall of the insulating gapfill pattern 150 in the first recess region RS1. The second semiconductor pillar SP2 may have a sixth thickness T6, which is greater than the fifth thickness T5, at a region below the lower portion 150LP of the insulating gapfill pattern 150. The fifth thickness T5 may be smaller than the second thickness T2. Since the second semiconductor pillar SP2 has a relatively small thickness (e.g., the sixth thickness T6), mobility of carriers in the second semiconductor pillar SP2 can be increased.

In certain embodiments, the lower portion 150LP of the insulating gapfill pattern 150 may not have a curved side surface. In other words, as illustrated in FIG. 3, the lower portion 150LP of the insulating gapfill pattern 150 may have a flat side surface. However, the bottom surface 150b and a portion of the insulating gapfill pattern 150 adjacent thereto may have a curved shape. In addition, the fifth thickness T5 may be substantially equal to the second thickness T2.

Figure 20:
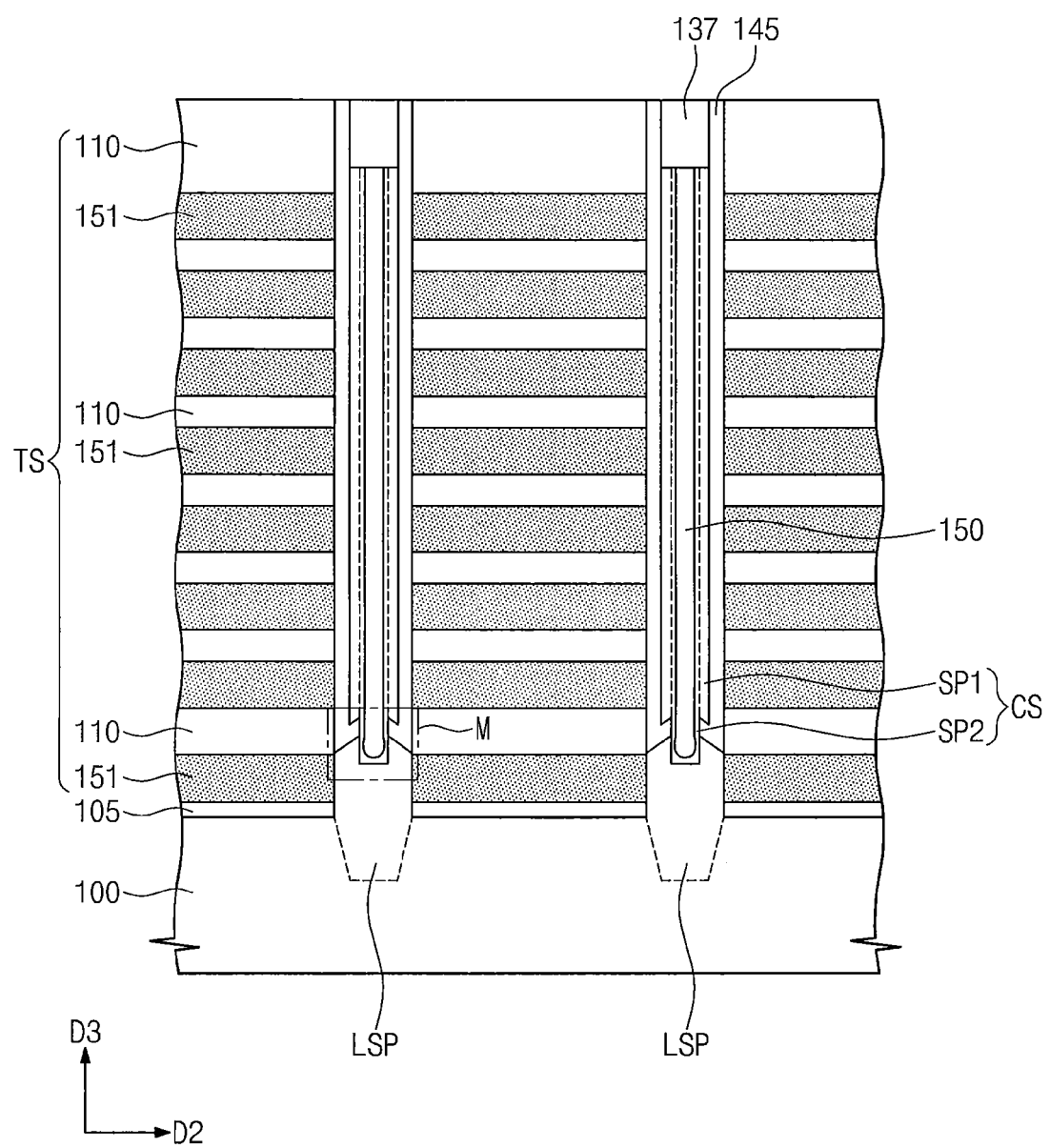
FIG. 20 is a sectional view illustrating a method of fabricating a three-dimensional semiconductor memory device according to some embodiments of the inventive concept.
Figure 21:
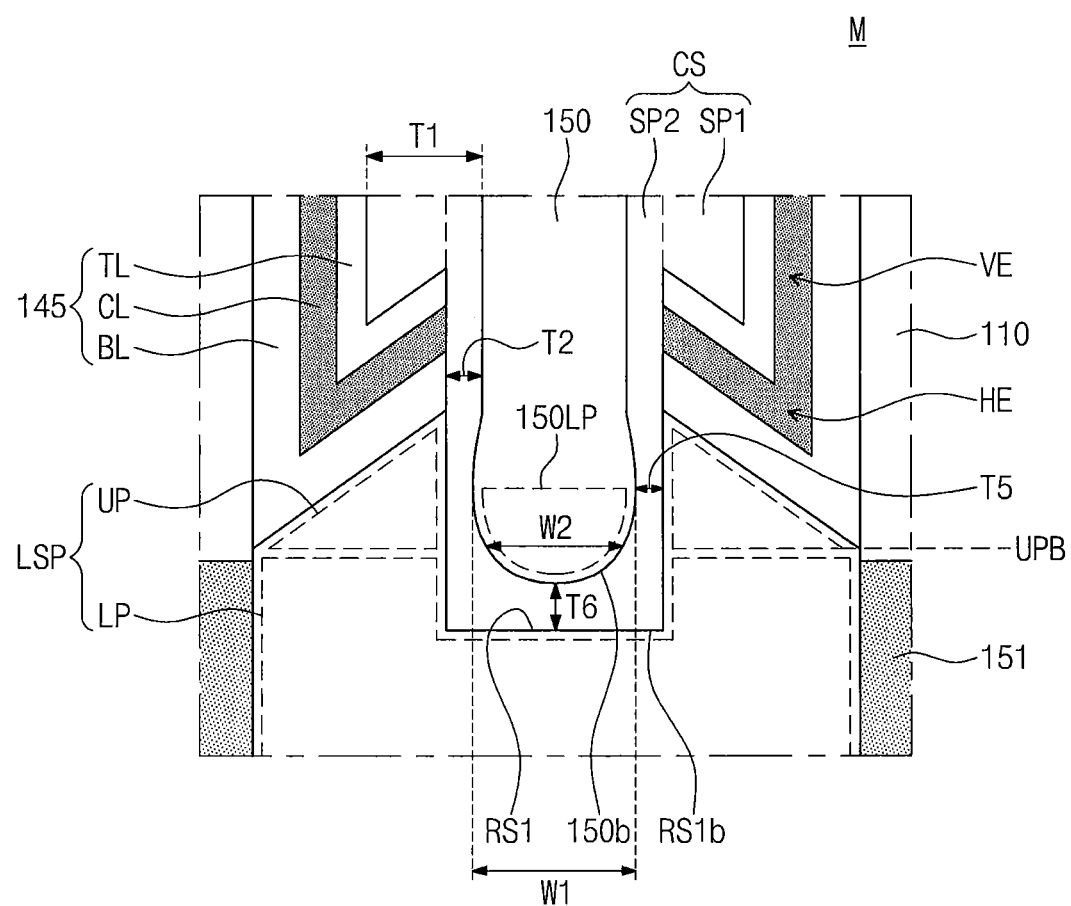
FIG. 21 is an enlarged sectional view of a portion 'M' of FIG. 20.

FIG. 20 is a sectional view illustrating a method of fabricating a three-dimensional semiconductor memory device according to some embodiments of the inventive concept. FIG. 21 is an enlarged sectional view of a portion 'M' of FIG. 20. In the following description of the present embodiment, an element or step previously described with reference to FIGS. 4 to 15 may be identified by a similar or identical reference number without repeating an overlapping description thereof.

Referring to FIGS. 20 and 21, a cleaning process may be performed on the structure of FIG. 8, and an insulating gapfill layer may be formed. As a result, the second semiconductor pillar SP2 and the insulating gapfill pattern 150 may be formed in each of the channel holes CH.

[Referring back to FIG. 21, the cleaning process may be performed on the second semiconductor layer SL2 of FIG. 9. As a result of the over-etching process or due to the presence of the first recess region RS1 with a large depth, the second semiconductor pillar SP2 may have a vertically-varying thickness after the cleaning process. For example, due to the vortex of the cleaning solution supplied into the channel hole CH, the second semiconductor layer SL2 in the first recess region RS1 may be partially removed to have a curved surface. As a result, the second semiconductor pillar SP2 may have several different thicknesses (e.g., the second, fifth, and sixth thicknesses T2, T5, and T6) in a direction toward the substrate 100.

In certain embodiments, the second semiconductor layer SL2 may be partially removed to have a curved surface in only the region that is adjacent to the bottom of the first recess region RS1. In this case, the second and fifth thicknesses T2 and T5 of the second semiconductor pillar SP2 may be substantially equal to each other.

The insulating gapfill pattern 150 in the first recess region RS1 may be formed to have a curved shape, owing to the curved surface of the second semiconductor pillar SP2. For example, the lower portion 150LP of the insulating gapfill pattern 150 may have at least two different widths in the direction toward the substrate 100; for example, the lower portion 150LP may have the first width W1 and the second width W2 that is smaller than the first width W1.

The subsequent process may be performed in substantially the same manner as that described with reference to FIGS. 12 to 15.

According to some embodiments of the inventive concept, a method of fabricating a semiconductor device may include etching a lower semiconductor pattern exposed by a channel hole in an over-etching manner to form a deep recess region in an upper portion of lower semiconductor pattern. This may make it possible to allow a channel structure formed in the channel hole to be stably connected to the lower semiconductor pattern. That is, it is possible to prevent the channel structure from being electrically disconnected from a substrate. In addition, a portion of the channel structure adjacent to the recess region may be formed to have a relatively thin thickness, and this may make it possible to allow the portion of the channel structure to have a reduced grain size. Accordingly, it is possible to increase mobility of electrons flowing through the channel structure and consequently to improve electric characteristics of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a stack including insulating layers and gate electrodes alternatingly and repeatedly stacked on a substrate;
   a lower semiconductor pattern protruding in a vertical direction from the substrate into the stack;
   an upper most portion of the lower semiconductor pattern that has a width that gradually decreases in a direction away from the substrate;
   a channel structure vertically penetrating the stack and connected to the lower semiconductor pattern; and
   an insulating gapfill pattern inside the channel structure, wherein a bottom surface of the insulating gapfill pattern extends into the lower semiconductor pattern beyond the upper most portion.

2. The device of claim 1, wherein the lower semiconductor pattern includes a recess region that penetrates the upper portion thereof, and
   a lower portion of the channel structure is in the recess region of the lower semiconductor pattern.

3. The device of claim 2, wherein an upper portion of the channel structure has a first thickness, and
   the lower portion of the channel structure has a second thickness that is less than the first thickness.

4. The device of claim 3, wherein the second thickness is about 10-40% of the first thickness.

5. The device of claim 1, wherein a lowest one of the gate electrodes comprises a ground selection line and the lower semiconductor pattern passes through the ground selection line.

6. The device of claim 1, wherein the channel structure comprises a first semiconductor pillar and a second semiconductor pillar,
   a bottom surface of the second semiconductor pillar is lower than that of the first semiconductor pillar, and
   the second semiconductor pillar contacts the lower semiconductor pattern.

7. The device of claim 1, further comprising a vertical insulator between the gate electrodes and the channel structure,
   wherein the vertical insulator comprises a horizontally extended portion which is between the channel structure and the lower semiconductor pattern, and
   the horizontally extended portion is parallel to a top surface of the lower semiconductor pattern and has an inclined profile.

8. The device of claim 7, wherein the horizontally extended portion directly covers the top surface of the lower semiconductor pattern.

9. The device of claim 7, wherein the vertical insulator comprises a tunnel insulating layer, a blocking insulating layer, and a charge storing layer between the tunnel insulating layer and the blocking insulating layer,
   the tunnel insulating layer is provided to directly cover an outer sidewall of the channel structure, and
   the blocking insulating layer directly covers inner sidewalls of the gate electrodes.

10. The device of claim 7, further comprising blocking insulating layers between the vertical insulator and the gate electrodes,
    wherein the vertical insulator comprises:
    a tunnel insulating layer directly covering an outer sidewall of the channel structure; and
    a charge storing layer between the tunnel insulating layer and the blocking insulating layers.

11. A semiconductor device, comprising:
a stack including insulating layers and gate electrodes alternatingly and repeatedly stacked on a substrate;
a lower semiconductor pattern protruding in a vertical direction from the substrate into the stack;
an upper portion of the lower semiconductor pattern having a width that gradually decreases in a direction away from the substrate;
a channel structure penetrating the stack and connected to the lower semiconductor pattern, a lower portion of the channel structure penetrates the upper portion of the lower semiconductor pattern; and
a vertical insulator between the gate electrodes and the channel structure;
wherein the vertical insulator comprises a horizontally extended portion which is between the channel structure and the lower semiconductor pattern, and
horizontally extended portion is parallel to a top surface of the lower semiconductor pattern and has an inclined profile.

12. The device of claim 11, wherein a level of a bottom surface of the channel structure is lower than a bottom level of the upper portion of the lower semiconductor pattern.

13. The device of claim 11, wherein an upper portion of the channel structure has a first thickness, and
the lower portion of the channel structure has a second thickness that is about 10-40% of the first thickness.

14. The device of claim 11, further comprising an insulating gapfill pattern inside the channel structure,
wherein a bottom surface of the insulating gapfill pattern is lower than a bottom of the upper portion of the lower semiconductor pattern.

15. The device of claim 11,
wherein the lower portion of the channel structure passes through the horizontally extended portion and is connected to the lower semiconductor pattern.

16. A semiconductor device, comprising:
a stack including insulating layers and gate electrodes alternatingly and repeatedly stacked on a substrate;
a lower semiconductor pattern protruding in a vertical direction from the substrate into the stack;
a channel structure in the stack and connected to the lower semiconductor pattern; and
an insulating gapfill pattern in the channel structure, wherein the insulating gapfill pattern has a curved bottom surface wherein an upper portion of the lower semiconductor pattern has a width gradually decreasing in a direction away from the substrate, and
a lowermost portion of the curved bottom surface of the insulating gapfill pattern below a bottom of the upper portion of the lower semiconductor pattern.

17. The device of claim 16, wherein a lower portion of the insulating gapfill pattern has a width gradually decreasing in a direction toward the substrate.

18. The device of claim 17, wherein the channel structure has a first thickness at a region adjacent to the lower portion of the insulating gapfill pattern,
the channel structure has a second thickness at a region below the lower portion of the insulating gapfill pattern, and
the second thickness is greater than the first thickness.

19. The device of claim 16, wherein the lower semiconductor pattern has a recess region,
the channel structure comprises a lower portion inserted into the recess region of the lower semiconductor pattern, and
the lower portion of the channel structure has a vertically-varying thickness.

* * * * *